(12) United States Patent
Hu et al.

(10) Patent No.: US 11,476,248 B2
(45) Date of Patent: Oct. 18, 2022

(54) THREE DIMENSIONAL INTEGRATED CIRCUIT AND FABRICATION THEREOF

(71) Applicants: TAIWAN SEMICONDUCTOR MANUFACTURING CO., LTD., Hsinchu (TW); NATIONAL YANG MING CHIAO TUNG UNIVERSITY, Hsinchu (TW)

(72) Inventors: Chenming Hu, Oakland, CA (US); Po-Tsang Haung, Hsinchu (TW)

(73) Assignees: TAIWAN SEMICONDUCTOR MANUFACTURING CO., LTD., Hsinchu (TW); NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 16/727,395

(22) Filed: Dec. 26, 2019

(65) Prior Publication Data
US 2021/0202475 A1    Jul. 1, 2021

(51) Int. Cl.
| H01L 27/06 | (2006.01) |
| H01L 27/12 | (2006.01) |
| H01L 21/02 | (2006.01) |
| H01L 21/822 | (2006.01) |
| H01L 21/8234 | (2006.01) |
| H01L 23/522 | (2006.01) |

(52) U.S. Cl.
CPC .... *H01L 27/0688* (2013.01); *H01L 21/02496* (2013.01); *H01L 21/8221* (2013.01); *H01L 21/823475* (2013.01); *H01L 23/5226* (2013.01); *H01L 27/1207* (2013.01)

(58) Field of Classification Search
CPC ............ H01L 27/0688; H01L 27/0694; H01L 27/281; H01L 21/8221; H01L 21/823475; H01L 23/5226
See application file for complete search history.

(56) References Cited

U.S. PATENT DOCUMENTS

| 8,754,533 | B2* | 6/2014 | Or-Bach | ............... | H01L 27/105 |
| | | | | | 257/777 |
| 9,099,526 | B2* | 8/2015 | Or-Bach | ............... | H01L 23/544 |
| 9,793,162 | B2* | 10/2017 | Fenouillet-Beranger | ..................... | |
| | | | | | H01L 27/0688 |
| 9,793,243 | B2* | 10/2017 | Lu | .......................... | H01L 23/528 |
| 9,859,112 | B2* | 1/2018 | Lin | ..................... | H01L 27/0688 |
| 10,607,938 | B1* | 3/2020 | Rubin | ................. | H01L 27/0688 |
| 10,714,400 | B2* | 7/2020 | Torek | .................. | H01L 29/7869 |
| 2002/0050634 | A1* | 5/2002 | Han | ..................... | H01L 25/0657 |
| | | | | | 257/686 |
| 2003/0057477 | A1* | 3/2003 | Hergenrother | ...... | H01L 27/0688 |
| | | | | | 257/328 |

(Continued)

*Primary Examiner* — Bac H Au
(74) *Attorney, Agent, or Firm* — Maschoff Brennan

(57) ABSTRACT

An integrated circuit structure includes a first transistor, an interconnect structure, a first dielectric layer, polycrystalline plugs, a semiconductor structure and a second transistor. The first transistor is formed on a substrate. The interconnect structure is over the first transistor. The first dielectric layer is over the interconnect structure. The polycrystalline plugs extend from a top surface of the dielectric layer into the dielectric layer. The semiconductor structure is disposed over the first dielectric layer. The second transistor is formed on the semiconductor structure.

20 Claims, 38 Drawing Sheets

(56) References Cited

U.S. PATENT DOCUMENTS

| | | | | |
|---|---|---|---|---|
| 2004/0262635 A1* | 12/2004 | Lee | ............... | H01L 29/792 |
| | | | | 257/199 |
| 2006/0115944 A1* | 6/2006 | Kwak | ............... | H01L 27/0688 |
| | | | | 438/199 |
| 2006/0234487 A1* | 10/2006 | Kim | ............... | H01L 21/76898 |
| | | | | 438/597 |
| 2007/0181880 A1* | 8/2007 | Kim | ............... | H01L 27/0688 |
| | | | | 257/67 |
| 2010/0032762 A1* | 2/2010 | Park | ............... | H01L 27/11526 |
| | | | | 257/350 |
| 2010/0190334 A1* | 7/2010 | Lee | ............... | H01L 24/24 |
| | | | | 438/637 |
| 2012/0068179 A1* | 3/2012 | Ishida | ............... | H01L 27/124 |
| | | | | 257/57 |
| 2012/0112314 A1* | 5/2012 | Jou | ............... | H01L 28/60 |
| | | | | 257/532 |
| 2013/0203248 A1* | 8/2013 | Ernst | ............... | H01L 27/11578 |
| | | | | 438/530 |
| 2013/0285116 A1* | 10/2013 | Lochtefeld | ............... | H01L 29/66666 |
| | | | | 257/190 |
| 2015/0333056 A1* | 11/2015 | Du | ............... | H01L 21/8221 |
| | | | | 257/773 |
| 2016/0181228 A1* | 6/2016 | Higuchi | ............... | H01L 24/09 |
| | | | | 257/774 |
| 2018/0025970 A1* | 1/2018 | Kao | ............... | H01L 27/088 |
| | | | | 257/401 |
| 2018/0082843 A1* | 3/2018 | Isogai | ............... | H01L 29/78696 |
| 2018/0122846 A1* | 5/2018 | Roy | ............... | H01L 23/481 |
| 2018/0350785 A1* | 12/2018 | Fong | ............... | H01L 24/83 |
| 2018/0374845 A1* | 12/2018 | Colinge | ............... | H01L 29/785 |
| 2019/0371671 A1* | 12/2019 | Fenouillet-Beranger | ............... | |
| | | | | H01L 21/76898 |
| 2020/0243515 A1* | 7/2020 | Zhou | ............... | H01L 21/8221 |
| 2021/0133550 A1* | 5/2021 | Seleznev | ............... | G06N 3/0635 |

\* cited by examiner

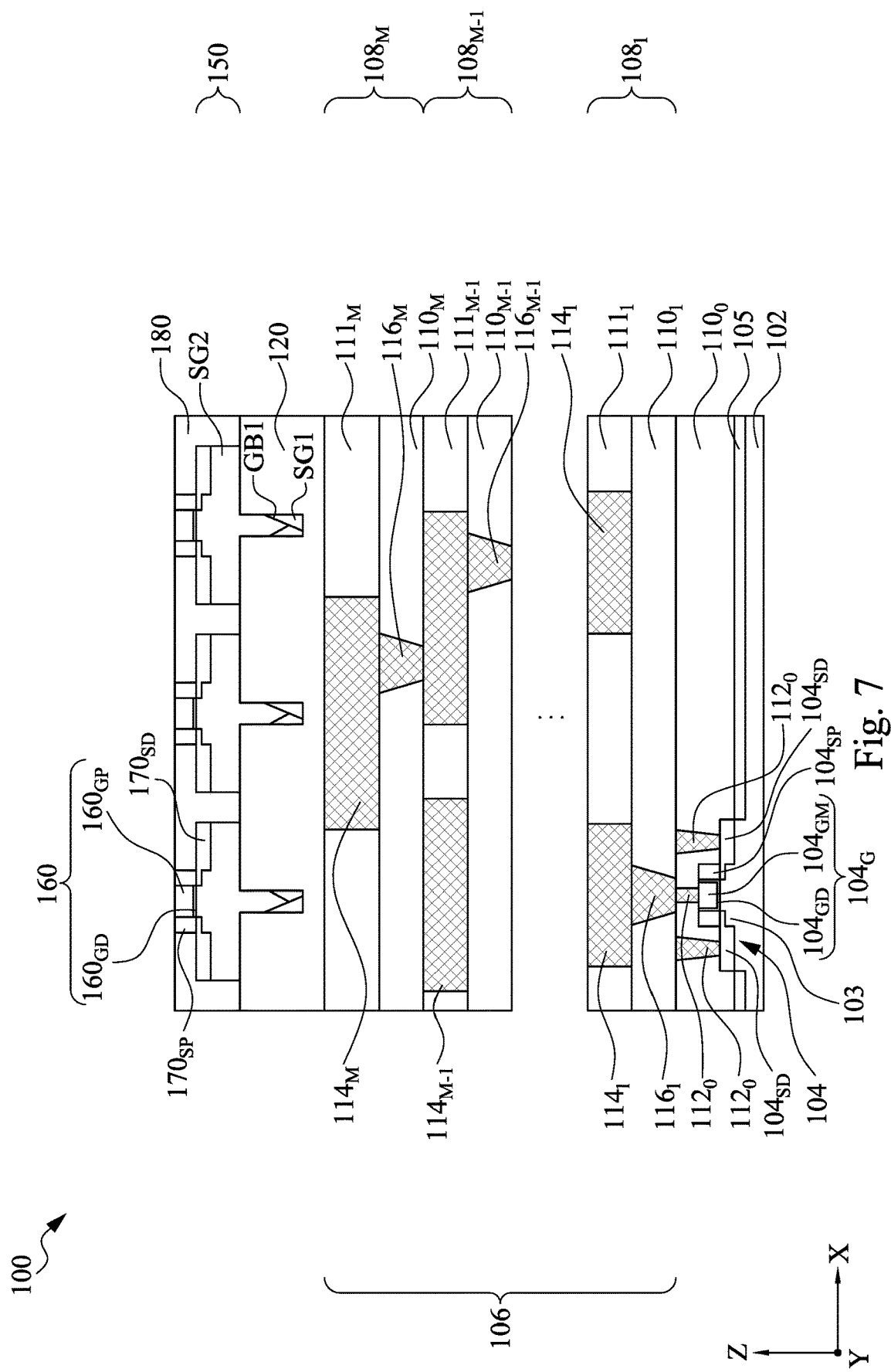

THREE DIMENSIONAL INTEGRATED CIRCUIT AND FABRICATION THEREOF

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-8 illustrate various intermediate stages of a method of forming an integrated circuit (IC) in accordance with some embodiments.

DETAILED DESCRIPTION

Figure 1A:
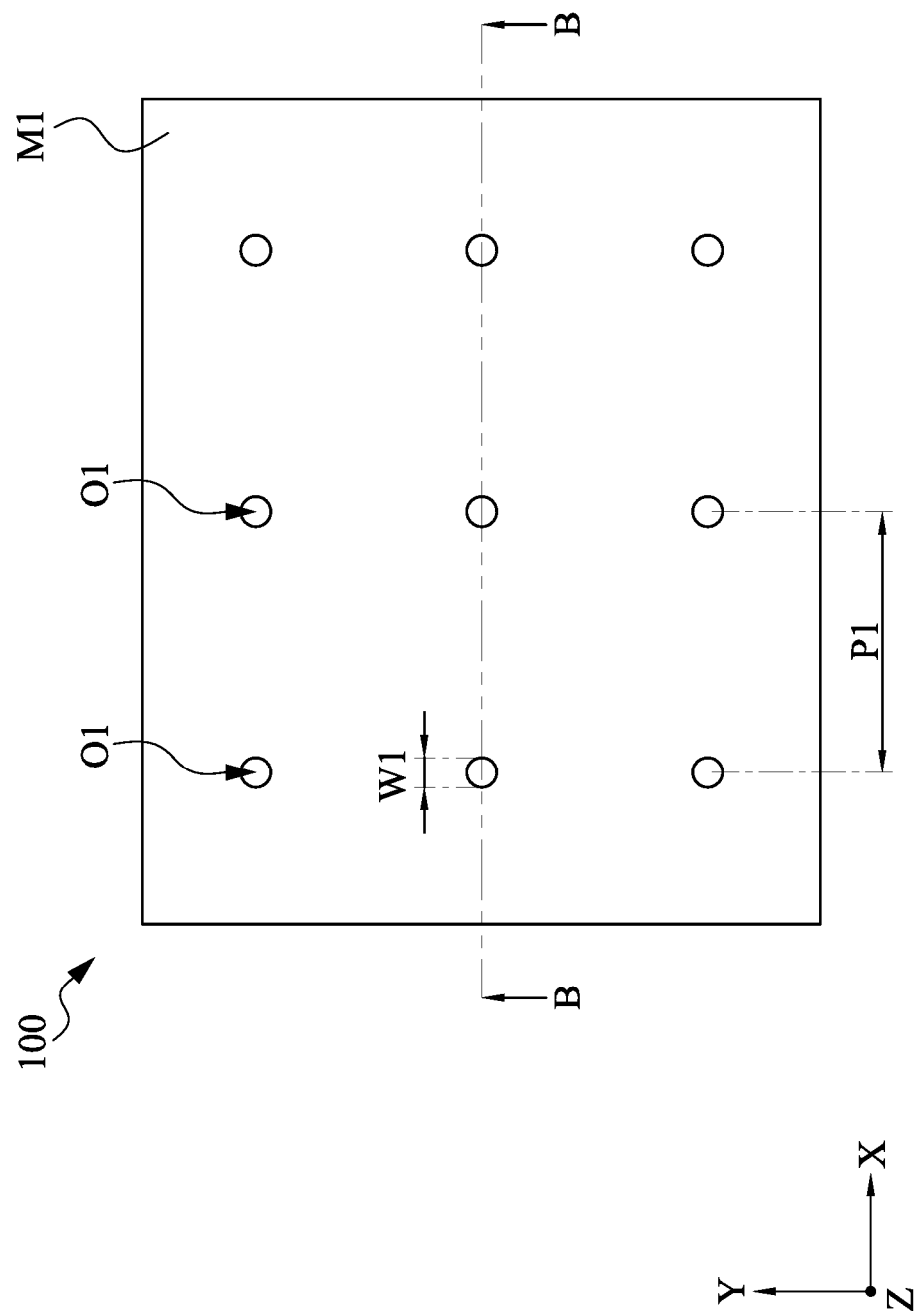

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-8 illustrate various intermediate stages of a method of forming an integrated circuit (IC) in accordance with some embodiments. FIG. 1A illustrates a top view of a patterned mask M1 formed over a semiconductor wafer 100, and FIG. 1B is a cross sectional view along B-B line of FIG. 1A. The semiconductor wafer 100 is an intermediate structure of an integrated circuit manufacturing process. In some embodiments, the semiconductor wafer 100 may comprise a substrate 102. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 104 (illustrated in FIG. 1B as a single transistor) are formed on the substrate 102. The one or more active and/or passive devices 104 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also formed as appropriate for a given application.

In some embodiments, an interconnect structure 106 is formed over the one or more active and/or passive devices 104 and the substrate 102. The interconnect structure 106 electrically interconnects the one or more active and/or passive devices 104 to form functional electrical circuits within the semiconductor structure 100. The interconnect structure 106 may comprise one or more metallization layers $108_1$ to $108_M$, wherein M+1 is the number of the one or more metallization layers $108_1$ to $108_M$. In some embodiments, the value of M may vary according to design specifications of the semiconductor structure 100. In what follows, the one or more metallization layers $108_1$ to $108_M$ may also be collectively referred to as the one or more metallization layers 108. The metallization layers $108_1$ to $108_M$ comprise dielectric layers $110_1$ to $110_M$ and dielectric layers $111_1$ to $111_M$, respectively. The dielectric layers $111_1$ to $111_M$ are formed over the corresponding dielectric layers $110_1$ to $110_M$. The metallization layers $108_1$ to $108_M$ comprise one or more horizontal interconnects, such as conductive lines $114_1$ to $114_M$, respectively extending horizontally or laterally in dielectric layers $111_1$ to $111_M$ and vertical interconnects, such as conductive vias $116_1$ to $116_M$, respectively extending vertically in dielectric layers $110_1$ to $110_M$. Formation of the interconnect structure 106 can be referred to as a back-end-of-line (BEOL) process.

Figure 1B:
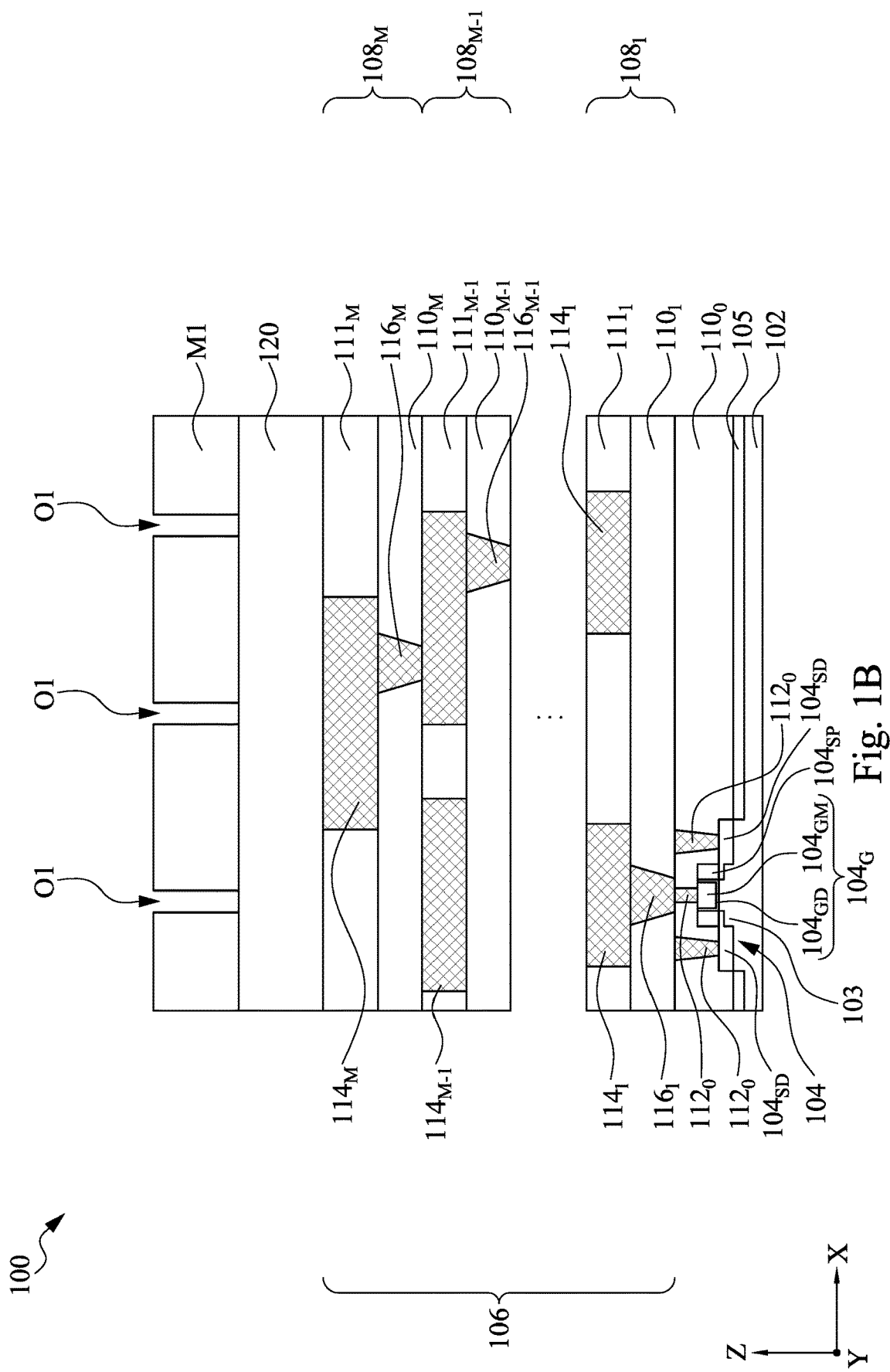

Contact plugs $112_0$ electrically couple the overlying interconnect structure 106 to the underlying devices 104. In the depicted embodiments, the devices 104 are fin field-effect transistors (FinFET) that are three-dimensional MOSFET structure formed in fin-like strips of semiconductor protrusions 103 referred to as fins. The cross-section shown in FIG. 1B is taken along a longitudinal axis of the fin in a direction parallel to the direction of the current flow between the source/drain regions $104_{SD}$. The fin 103 may be formed by patterning the substrate 102 using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 103 by etching a trench into the substrate 102 using, for example, reactive ion etching (RIE). FIGS. 1A and 1B illustrate a single fin 103, although the substrate 102 may comprise any number of fins.

Shallow trench isolation (STI) regions 105 formed along opposing sidewalls of the fin 103 are illustrated in FIG. 1B. STI regions 105 may be formed by depositing one or more dielectric materials (e.g., silicon oxide) to completely fill the trenches around the fins and then recessing the top surface of the dielectric materials. The dielectric materials of the STI regions 105 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 105 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 105 such that an upper portion of fins 103 protrudes from surrounding insulating STI regions 105. In some cases, the patterned hard mask used to form the fins 103 may also be removed by the planarization process.

In some embodiments, a gate structure $104_G$ of the FinFET device 104 illustrated in FIG. 1B is a high-k, metal gate (HKMG) gate structure that may be formed using a gate-last process flow. In a gate-last process flow a sacrificial dummy gate structure (not shown) is formed after forming the STI regions 105. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 105. As described in greater detail below, the dummy gate structure may be replaced by the HKMG gate structure $104_G$ as illustrated in FIG. 1B. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source/drain regions $104_{SD}$ and spacers $104_{SP}$ of FinFET 104, illustrated in FIG. 1B, are formed, for example, self-aligned to the dummy gate structures. Spacers $104_{SP}$ may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers $104_{SP}$ along the sidewalls of the dummy gate structures extending laterally onto a portion of the surface of the fin 103.

Source/drain regions $104_{SD}$ are semiconductor regions in direct contact with the semiconductor fin 103. In some embodiments, the source/drain regions $104_{SD}$ may comprise heavily-doped regions and relatively lightly-doped drain extensions, or LDD regions. Generally, the heavily-doped regions are spaced away from the dummy gate structures using the spacers $104_{SP}$, whereas the LDD regions may be formed prior to forming spacers $104_{SP}$ and, hence, extend under the spacers $104_{SP}$ and, in some embodiments, extend further into a portion of the semiconductor fin 103 below the dummy gate structure. The LDD regions may be formed, for example, by implanting dopants (e.g., As, P, B, In, or the like) using an ion implantation process.

The source/drain regions $104_{SD}$ may comprise an epitaxially grown region. For example, after forming the LDD regions, the spacers $104_{SP}$ may be formed and, subsequently, the heavily-doped source and drain regions may be formed self-aligned to the spacers $104_{SP}$ by first etching the fins to form recesses, and then depositing a crystalline semiconductor material in the recess by a selective epitaxial growth (SEG) process that may fill the recess and may extend further beyond the original surface of the fin 103 to form raised source/drain epitaxy structures. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions $104_{SD}$ either in situ during SEG, or by an ion implantation process performed after the SEG, or by a combination thereof.

Once the source/drain regions $104_{SD}$ are formed, a first ILD layer (e.g., lower portion of the ILD layer $110_O$) is deposited over the source/drain regions $104_{SD}$. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer. The HKMG gate structures $104_G$, illustrated in FIG. 1B, may then be formed by first removing the dummy gate structures using one or more etching techniques, thereby creating recesses between respective spacers $104_{SP}$. Next, a replacement gate dielectric layer $104_{GD}$ comprising one more dielectrics, followed by a replacement gate metal layer $104_{GM}$ comprising one or more metals, are deposited to completely fill the recesses. Excess portions of the gate structure layers $104_{GD}$ and $104_{GM}$ may be removed from over the top surface of first ILD using, for example, a CMP process. The resulting structure, as illustrated in FIG. 1B, may include remaining portions of the HKMG gate layers $104_{GD}$ and $104_{GM}$ inlaid between respective spacers $104_{SP}$.

The gate dielectric layer $104_{GD}$ includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the gate metal layer $104_{GM}$ may be a multilayered metal gate stack comprising a barrier layer, a work function layer, and a gate-fill layer formed successively on top of gate dielectric layer $104_{GD}$. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

After forming the HKMG structure $104_G$, a second ILD layer is deposited over the first ILD layer, and these ILD layers are in combination referred to as the ILD layer $110_O$, as illustrated in FIG. 1B. In some embodiments, the insulating materials to form the first ILD layer and the second ILD layer may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer and the second ILD layer may be deposited using any suitable method, such as CVD, physical vapor deposition (PVD), ALD, PEALD, PECVD, SACVD, FCVD, spin-on, and/or the like, or a combination thereof.

As illustrated in FIG. 1B, electrodes of electronic devices formed in the substrate 102 may be electrically connected to conductive lines $114_1$ to $114_M$ and the conductive vias $116_1$ to $116_M$ using contacts $112_O$ formed through the intervening dielectric layers. In the example illustrated in FIG. 1B, the contacts $112_O$ make electrical connections to the gate structure $104_G$ and the source/drain regions $104_{SD}$ of FinFET 104. The contacts $112_O$ may be formed using photolithography, etching and deposition techniques.

For example, a patterned mask may be formed over the ILD layer $110_O$ and used to etch openings that extend through the ILD layer $110_O$ to expose the gate structure $104_G$ as well as the source/drain regions $104_{SD}$. Thereafter, conductive liner may be formed in the openings in the ILD layer $110_O$. Subsequently, the openings are filled with a conductive fill material. The liner comprises barrier metals used to reduce out-diffusion of conductive materials from the contacts $112_O$ into the surrounding dielectric materials. In some embodiments, the liner may comprise two barrier metal layers. The first barrier metal comes in contact with the semiconductor material in the source/drain regions $104_{SD}$ and may be subsequently chemically reacted with the heavily-doped semiconductor in the source/drain regions $104_{SD}$ to form a low resistance ohmic contact, after which the unreacted metal may be removed. For example, if the heavily-doped semiconductor in the source/drain regions $104_{SD}$ is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the ILD $110_O$. The resulting conductive plugs extend into the ILD layer $110_O$ and constitute contacts $112_O$ making physical and electrical connections to the electrodes of electronic devices, such as the tri-gate FinFET 104 illustrated in FIG. 1B.

After forming the contacts $112_O$, the interconnect structure 106 including multiple interconnect levels may be formed, stacked vertically above the contact plugs $112_O$ formed in the ILD layer $110_O$, in accordance with a back end of line (BEOL) scheme adopted for the integrated circuit design. In the BEOL scheme illustrated in FIG. 1B, various interconnect levels have similar features. However, it is understood that other embodiments may utilize alternate integration schemes wherein the various interconnect levels may use different features. For example, the source/drain contacts $112_O$, which are shown as vertical connectors, may be extended to form conductive lines which transport current laterally.

The multiple interconnect levels include, for example, the conductive lines $114_1$ to $114_M$ and the conductive vias $116_1$ to $116_M$ that may be formed in the respective IMD layers $110_1$ to $110_M$ and $111_1$ to $111_M$ using any suitable method, such as a single damascene process, a dual damascene process, or the like. In some embodiments, the IMD layers $110_1$ to $110_M$ and $111_1$ to $111_M$ may include low-k dielectric materials having k values, for example, lower than about 4.0 or even 2.0 disposed between such conductive features. In some embodiments, the IMD layers may be made of, for example, phosphosilicate glass (PSG), borophosphosilicate glass (BPSG), fluorosilicate glass (FSG), SiOxCy, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The conductive lines $114_1$ to $114_M$ and the conductive vias $116_1$ to $116_M$ may comprise conductive materials such as copper, aluminum, tungsten, combinations thereof, or the like. In some embodiments, the conductive lines $114_1$ to $114_M$, and the conductive vias $116_1$ to $116_M$ may further comprise one or more barrier/adhesion layers (not shown) to protect the respective IMD layers $110_1$ to $110_M$ and $111_1$ to $111_M$ from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

An additional ILD layer 120 is formed over the metallization layer $108_M$ of interconnect structure 106 using, for example, PVD, CVD, ALD or the like. The ILD layer 120 will be etched to form holes that are used to control grain boundaries of a polysilicon layer subsequently formed in the ILD layer 120, which will be discussed in greater detail below. Therefore, the ILD layer 120 plays a different role than the underlying IMD layers $110_1$ to $110_M$ and $111_1$ to $111_M$ and ILD layer $110_0$, and thus may have a different thickness and/or material than the IMD layers $110_1$ to $110_M$ and $111_1$ to $111_M$ and ILD layer $110_0$. For example, the ILD layer 120 may be thicker or thinner than one or more of the IMD layers $110_1$ to $110_M$ and $111_1$ to $111_M$ and ILD layer $110_0$. Alternatively, the ILD layer 120 may have a same thickness and/or material as one or more of the IMD layers $110_1$ to $110_M$ and $111_1$ to $111_M$ and ILD layer $110_0$.

In some embodiments, the ILD layer 120 may include low-k dielectric materials having k values, for example, lower than about 4.0 or even 2.0. For example, the ILD layer 120 may be made of, for example, phosphosilicate glass (PSG), borophosphosilicate glass (BPSG), fluorosilicate glass (FSG), SiOxCy, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like.

A patterned mask layer M1 is formed over the ILD layer 120 for patterning the ILD layer 120. The patterned mask layer M1 may comprise an organic material, such as a photoresist material, and may be formed using a spin-on coating process, followed by patterning the photoresist material to forming a plurality of holes O1 extending through the patterned mask layer M1 using suitable lithography techniques. For example, photoresist material is irradiated (exposed) and developed to remove portions of the photoresist material. In greater detail, a photomask (not shown) may be placed over the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used. Thus, the holes O1 as illustrated in FIGS. 1A and 1B are formed in the patterned photoresist layer M1.

As illustrated in FIG. 1A, the holes O1 are arranged in rows and columns, or other regular patterns such as hexagonal pattern, and the pattern of holes O1 will be transferred to the underlying ILD layer 120 in a subsequent step. In some embodiments, the holes O1 in the patterned photoresist layer M1 have a width W1 (e.g., diameter if holes O1 are round holes) in a range from about 5 nm to about 500 nm and spaced equidistantly at a center-to-center pitch P1 in a range from about 0.1 micron to about 50 micron. The width W1 and pitch P1 are chosen based on desired holes' dimensions that will be subsequently formed in the ILD layer 120, in such a way that grain boundaries of a polysilicon layer formed over the ILD layer 120 can be well controlled.

Figure 2A:
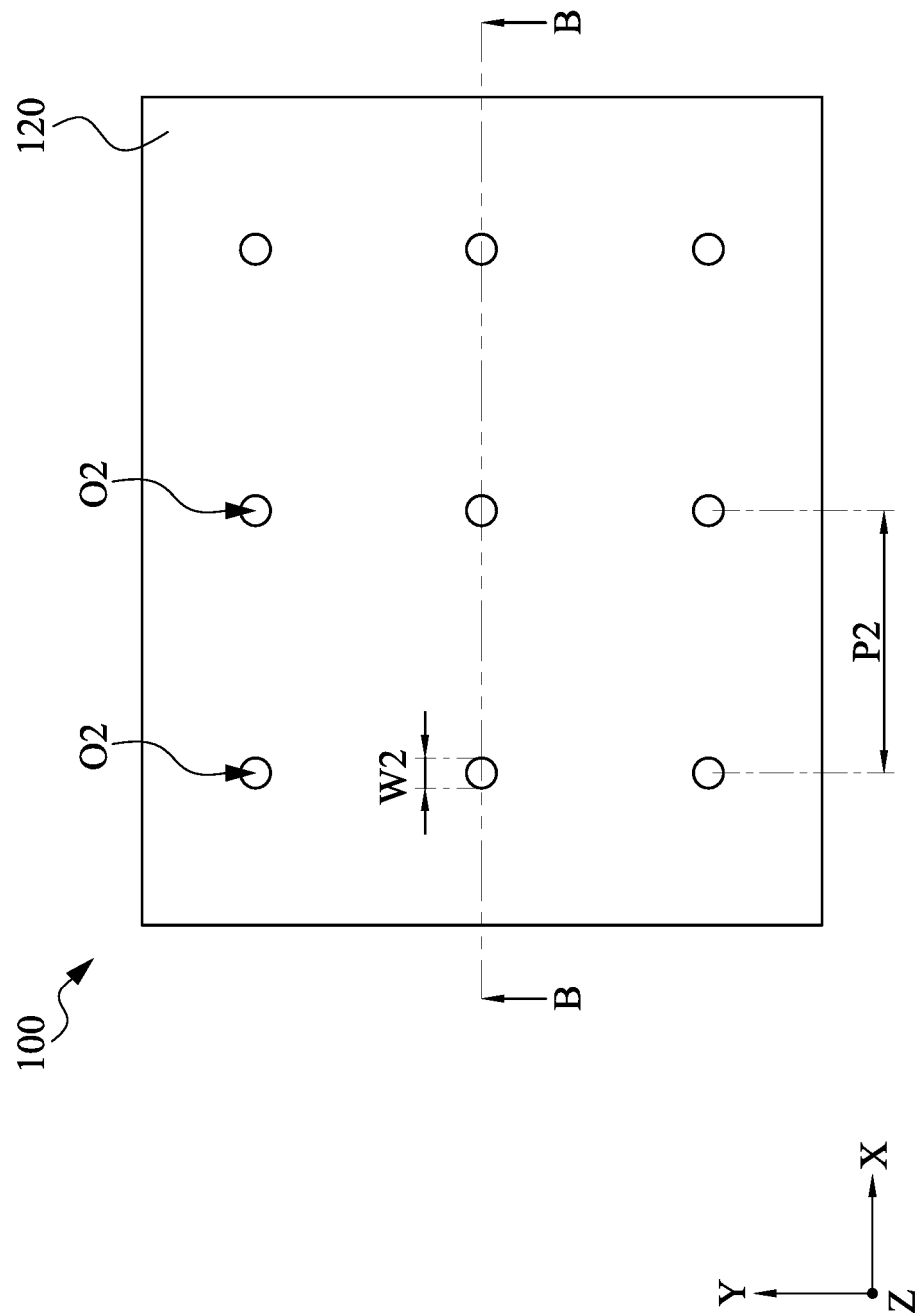
Figure 2B:
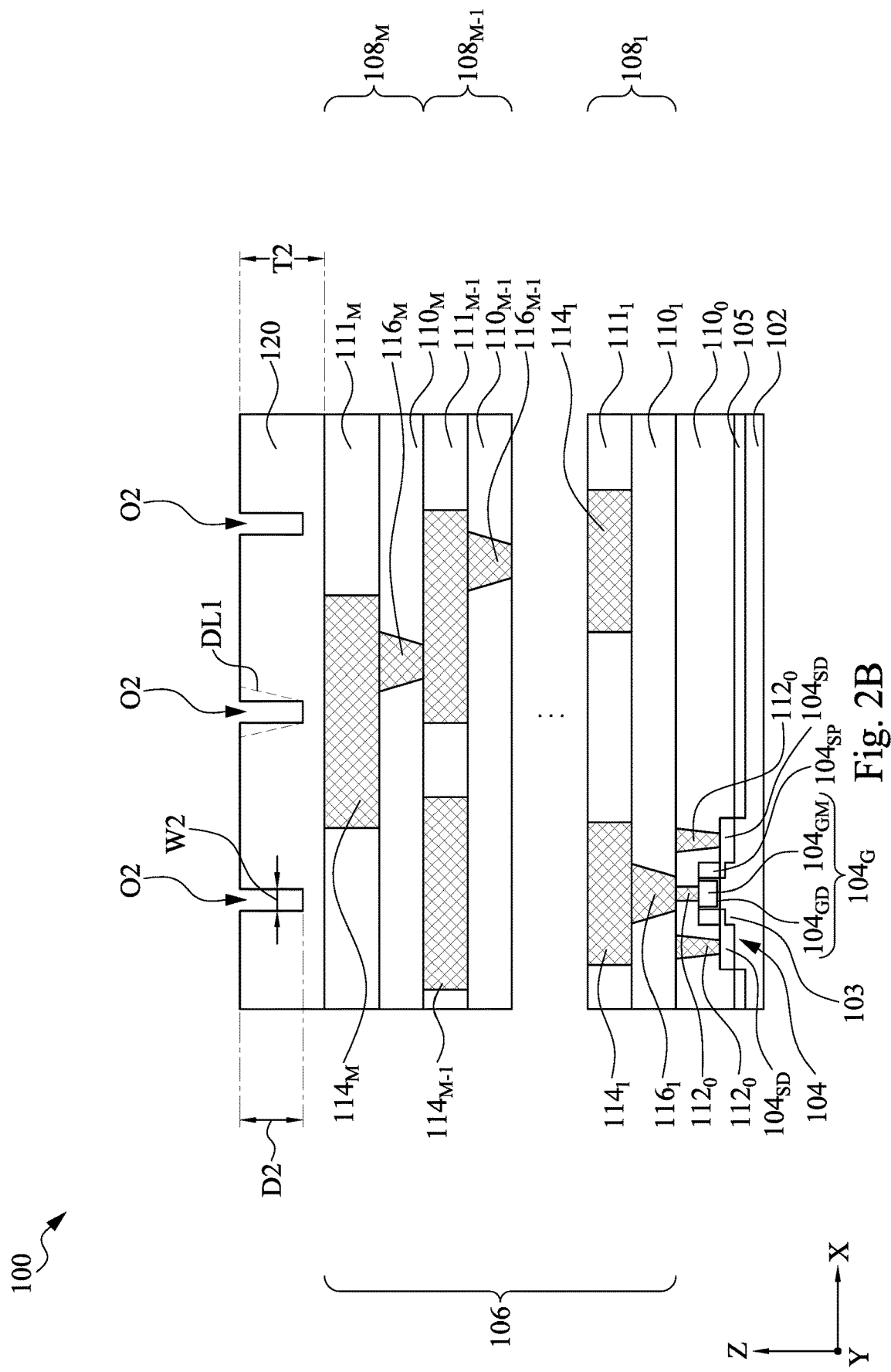

After forming the patterned mask layer M1, a patterning process is performed on the ILD layer 120 to transfer the pattern of the holes O1 in the patterned mask layer M1 to the underlying ILD layer 120, resulting in holes O2 in the patterned ILD layer 120, as illustrated in FIGS. 2A and 2B, wherein FIG. 2A is a top view of the patterned ILD layer 120, and FIG. 2B is a cross-sectional view taken along B-B line as shown in FIG. 2A. In some embodiments, the patterning process comprises one or more etching processes, where the patterned mask layer M1 is used as an etch mask. The one or more etching processes may include wet etching processes, anisotropic dry etching processes, or combinations thereof, and may use an etchant that etches the ILD layer 120 at a faster etch rate than it etches the patterned mask layer M1. For example, the etchant comprises hydrofluoric acid or the like, if the ILD layer 120 is made of silicon oxide. After patterning the ILD layer 120, the patterned mask layer M1 is removed, for example, using a plasma ash process. In some embodiments, a plasma ash process is performed such that the temperature of the photoresist mask M1 is increased until the photoresist mask M1 experiences a thermal decomposition and may be removed. However, any other suitable process, such as a wet strip, may be utilized.

Because the ILD layer 120 inherits the pattern from the patterned mask layer M1, the holes O2 in the ILD layer 120 have substantially same shapes, sizes and center-to-center pitches as the respective holes O1 in the patterned mask layer M1 (see FIGS. 1A and 1B). By way of example and not limitation, as illustrated in FIG. 2A, the holes O2 in the ILD layer 120 have a width W2 (e.g., diameter if holes O2 are round holes) in a range from about 5 nm to about 500 nm and spaced equidistantly at a center-to-center pitch P2 in a range from about 0.1 micron to about 50 micron. The width W2 and pitch P2 are chosen to control grain boundaries of a polysilicon layer that will be subsequently formed over the ILD layer 120. Although the holes O2 illustrated in FIG. 2B have vertical sidewalls, the etching process may lead to tapered sidewalls, as indicated by dash line DL1, in some other embodiments.

In some embodiments, as illustrated in FIG. 2B, the holes O2 are deeper than half a thickness T2 of the ILD layer 120 but do not pass through the ILD layer 120. Stated another way, the holes O2 in the ILD layer 120 have a depth D2 greater than half the thickness T2 of the ILD layer 120 but less than the thickness T2 of the ILD layer 120. Excessively small depth D2 may impair grain boundaries control during forming a polysilicon layer in a subsequent step, which will be explained in greater detail below. Excessively large depth D2 may result in excessively large aspect ratio (i.e., ratio of the depth D2 to the width W2) of the holes O2, which in turn would adversely impact a following deposition process for forming the polysilicon layer. In some embodiments, the depth D2 is greater than the width W2, which in turn will aid in growing a single silicon grain beyond a single hole O2, as will be described in greater detail below.

Figure 2C:
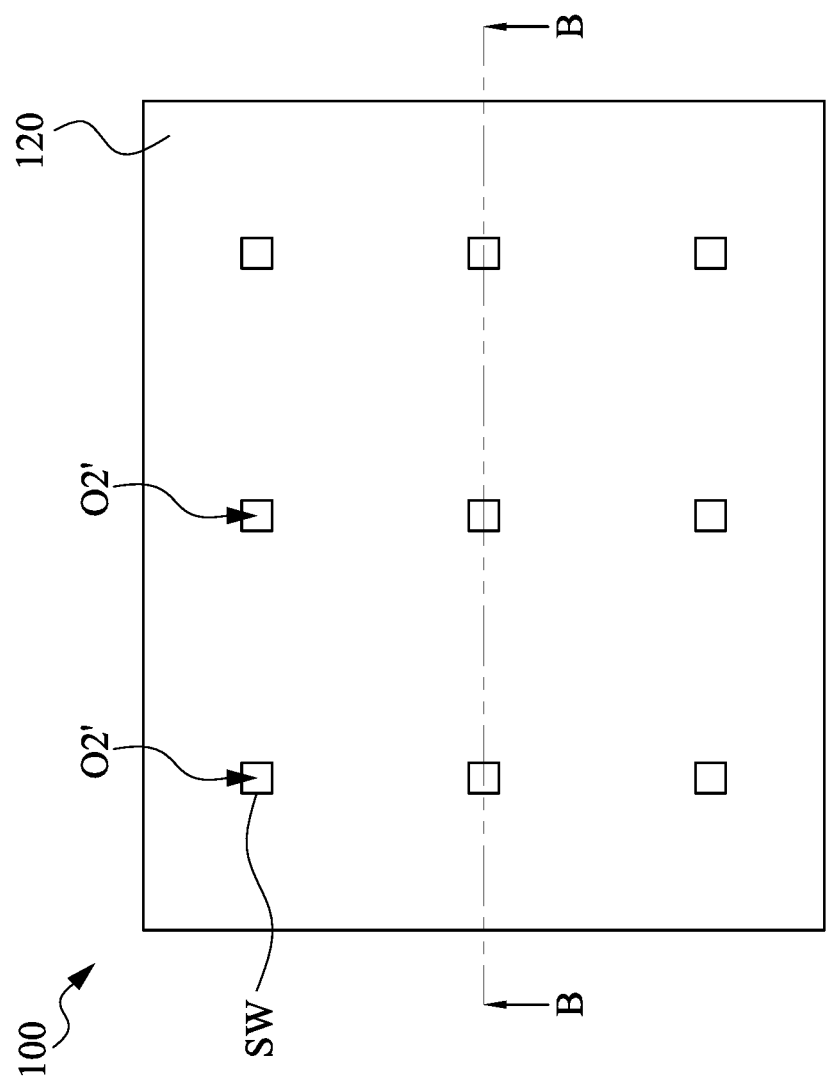

Although the holes depicted in FIG. 2A are round (or circular) holes when viewed from above, holes with other suitable shapes may also be formed in the ILD layer 120. FIG. 2C illustrates a top view of an alternative embodiment of the holes O2' formed in the ILD layer 120. The holes O2' may be square holes (or rectangular holes) each having four straight sidewalls SW aligned with one or more desired crystallographic direction of the silicon cubic lattice, as described in greater detail below.

Figure 2F:
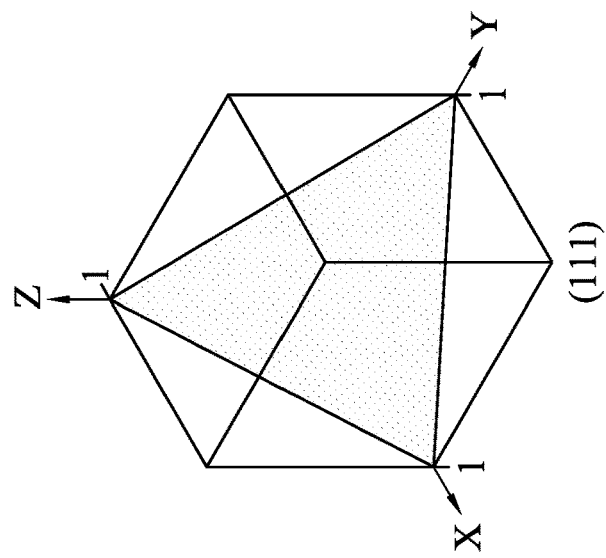
Figure 2E:
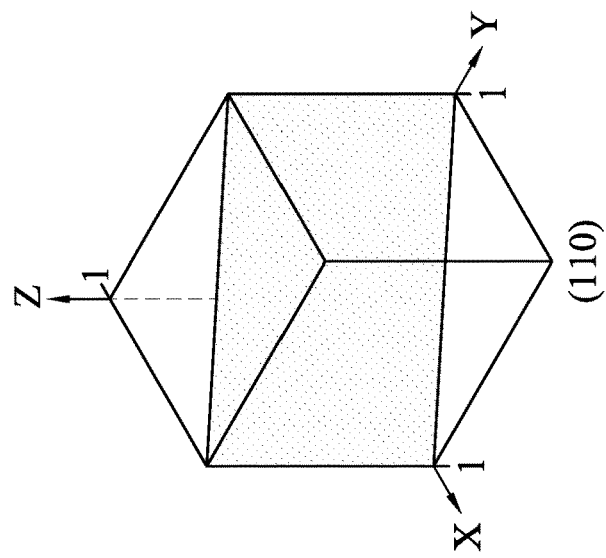
Figure 2D:
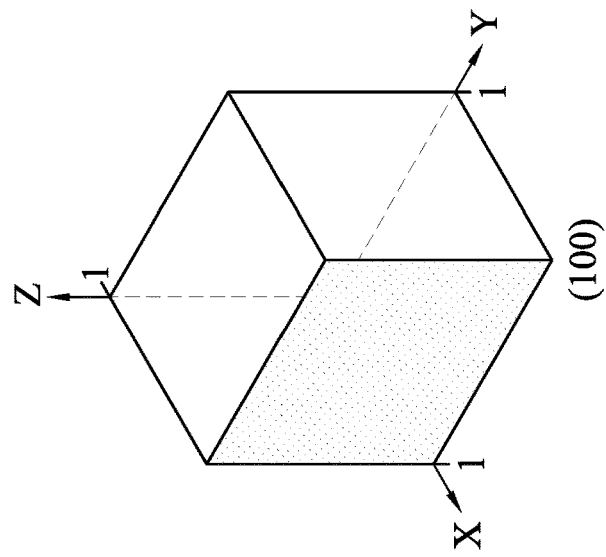

In crystalline silicon, the atoms which make up the solid are arranged in a periodic fashion. If the periodic arrangement exists throughout the entire solid, the substance is defined as being formed of a single crystal. If the solid is composed of a myriad of single crystal regions the solid is referred to as polycrystalline material. As readily understood by skilled artisans, periodic arrangement of atoms in a crystal is called the lattice. The crystal lattice also contains a volume which is representative of the entire lattice and is referred to as a unit cell that is regularly repeated throughout the crystal. For example, silicon has a diamond cubic lattice structure, which can be represented as two interpenetrating face-centered cubic lattices. Thus, the simplicity of analyzing and visualizing cubic lattices can be extended to characterization of silicon crystals. In the description herein, references to various planes in silicon crystals will be made, especially to the (100), (110), and (111) planes. These planes define the orientation of the plane of silicon atoms relative to the principle crystalline axes. The numbers {xyz} are referred to as Miller indices and are determined from the reciprocals of the points at which the crystal plane of silicon intersects the principle crystalline axes. Thus, FIGS. 2D-2F show three orientations of the crystal plane of silicon. In FIG. 2D, the crystal plane of silicon intersects the x-axis at 1 and never intersects y or z-axis. Therefore, the orientation of this type of crystalline silicon is (100). Similarly, FIG. 2E shows (110) crystalline silicon and FIG. 2F shows (111) silicon. Notably, for any given plane in a cubic crystal there are five other equivalent planes. Thus, the six sides of the cube comprising the basic unit cell of the crystal are all considered (100) planes. The notation {xyz} refers to all six of the equivalent (xyz) planes. Throughout the description, reference will also be made to the crystal directions, especially the <100>, <110> and <111> directions. These are defined as the normal direction to the respective plane. Thus, the <100> direction is the direction normal to the (100) plane. The notation <xyz> refers to all six equivalent directions.

Reference is made back to FIG. 2C. One or more sidewalls SW of the square or rectangular holes O2' is aligned with one or more desired crystallographic directions of silicon (e.g., <100>, <110> or <111> direction). In this way, the crystal lattice orientation of silicon grains of the subsequently formed polysilicon layer may be controlled. Sidewall orientation of the holes O2' can be controlled by using the lithography and etching techniques performed on the ILD layer 120.

Figure 3A:
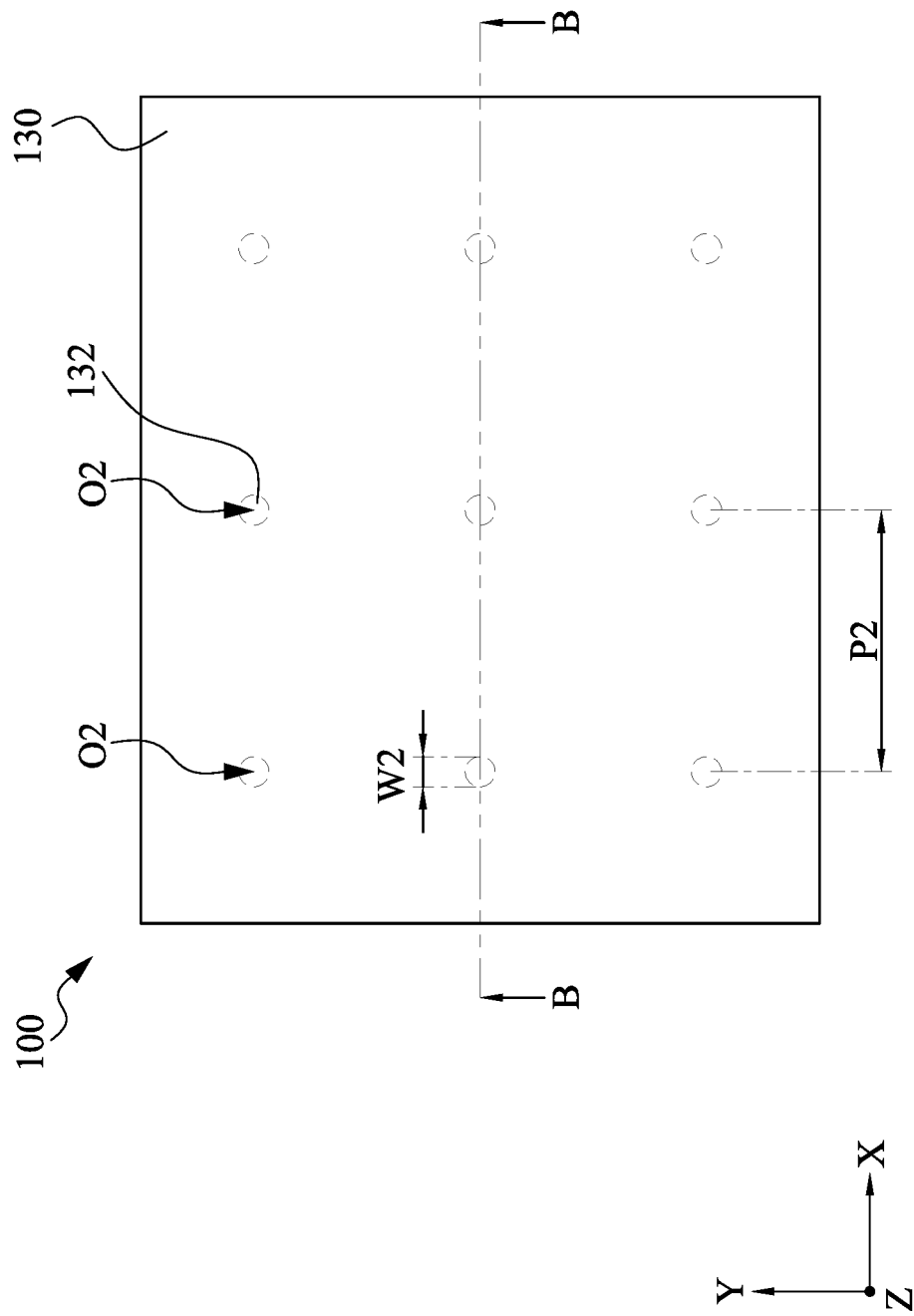
Figure 3B:
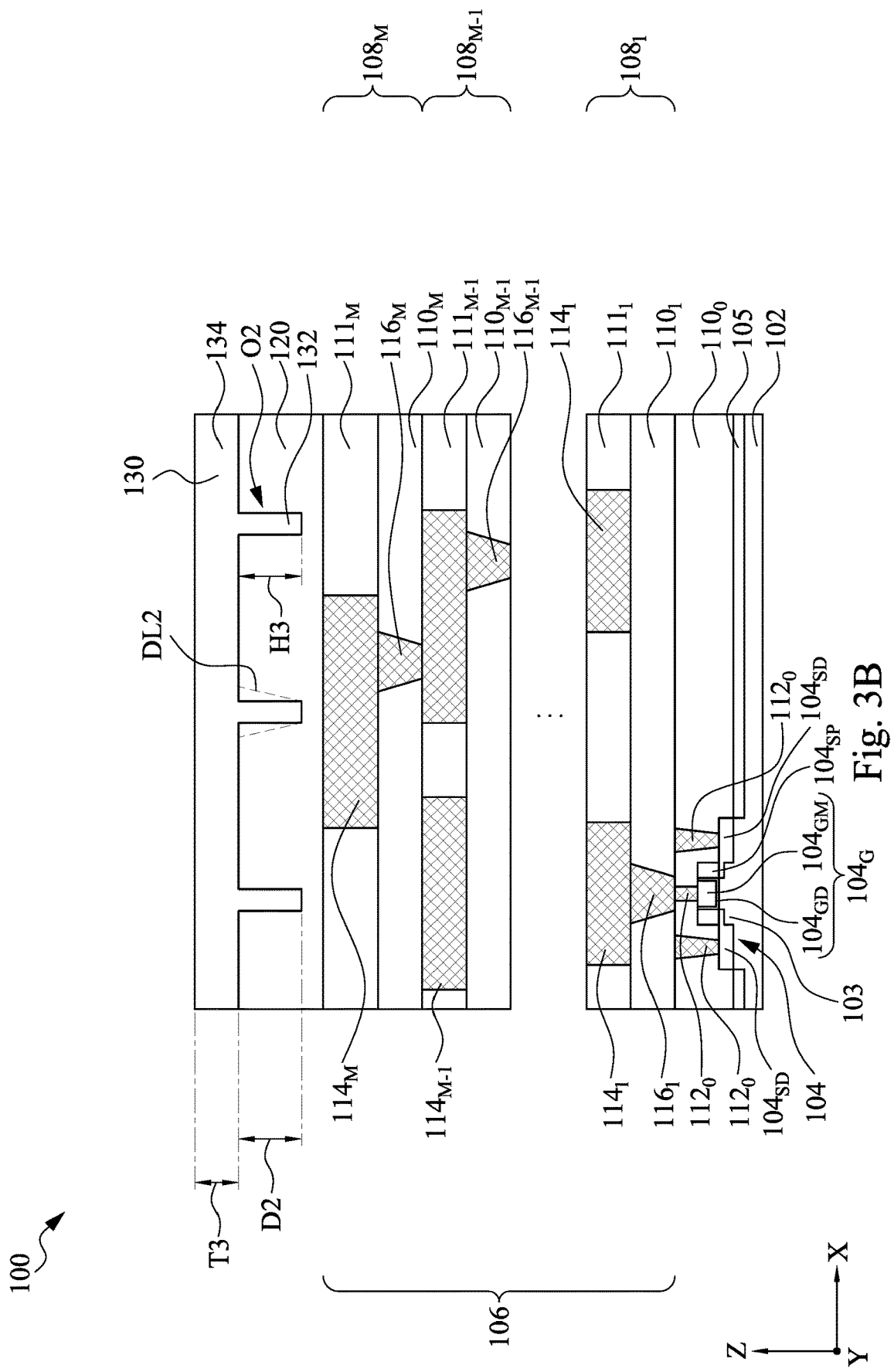

FIGS. 3A and 3B illustrate an amorphous silicon layer (interchangeably referred to as amorphous layer) 130 formed over the patterned ILD layer 120, wherein FIG. 3A is a top view of the amorphous silicon layer 130, and FIG. 3B is a cross-sectional view taken along B-B line as shown in FIG. 3A. Formation of the amorphous silicon layer 130 includes CVD, ALD, the like, or other suitable processes. In some embodiments, the amorphous silicon layer 130 may be deposited by using silicon-containing gases (e.g., $SiH_4$, $Si_2H_6$, $Si_3H_8$) as precursor gases. The amorphous silicon layer may be deposited, for example, at a flow rate of the silicon-containing gas in the range from about 1000 standard cubic centimeters per minute (sccm) to about 2000 sccm, at a temperature in a rage from about 350 degrees Centigrade to about 600 degrees Centigrade, at a pressure in a range from about 400 mTorr to about 1 Torr. These process conditions for forming the amorphous silicon layer 130 is intended to be illustrative and is not intended to be limiting to embodiments of the present disclosure. Rather, any suitable processes and associated process conditions may be used.

Silicon atoms deposited on the ILD layer 120 tend to form an amorphous solid (i.e., non-crystalline solid) that lacks the long-range order of a crystal, because the dielectric material in the ILD layer 120 is amorphous in nature. At an initial stage, the amorphous silicon 130 is conformally deposited into the holes O2 (or square holes O2' as shown in FIG. 2C) in the ILD layer 120 and on a top surface of the ILD layer 120, and the deposition process then continues until the holes O2 in the ILD layer 120 are overfilled with the amorphous silicon layer 130.

As a result of the deposition process, the amorphous silicon layer 130 includes amorphous silicon plugs 132 extending in the holes O2 in the ILD layer 120, and an amorphous silicon lateral portion 134 extending along a top surface of the ILD layer 120. Height H3 of the amorphous silicon plugs 132 is equal to the depth D2 of the holes O2 in the ILD layer 120, and thus is greater than half the thickness T2 of the ILD layer 120 but less than the thickness T2 of the ILD layer 120. Thickness T3 of the amorphous silicon lateral portion 134 can be less than, greater than, or equal to the height H3 of the amorphous silicon plugs 132. In some embodiments, the height H3 of amorphous silicon plugs 132 is greater than the width of the amorphous silicon plugs 132, which in turn will aid in growing a single silicon grain beyond a single hole O2, as will be described in greater detail below.

In the depicted embodiments as shown in FIG. 3A, the amorphous silicon plugs 132 each have a round shape when viewed from above, if the amorphous silicon plugs 132 are formed in respective round holes O2. However, the round shape of plugs 132 is intended to be illustrative and is not intended to be limiting to embodiments of the present disclosure. For example, if the amorphous silicon plugs 132 are formed in square or rectangular holes O2' as illustrated in FIG. 2C, the amorphous silicon plugs 132 would have a square or rectangular shape when viewed from above. Moreover, in some embodiments where the holes O2 in the ILD layer 120 have tapered sidewalls, as indicated by dash line DL1 illustrated in FIG. 2B, the amorphous silicon plugs 132 and the tapered sidewalls of the holes O2 may form tapered interfaces, as indicated by dash line DL2 illustrated in FIG. 3B.

Figure 4A:
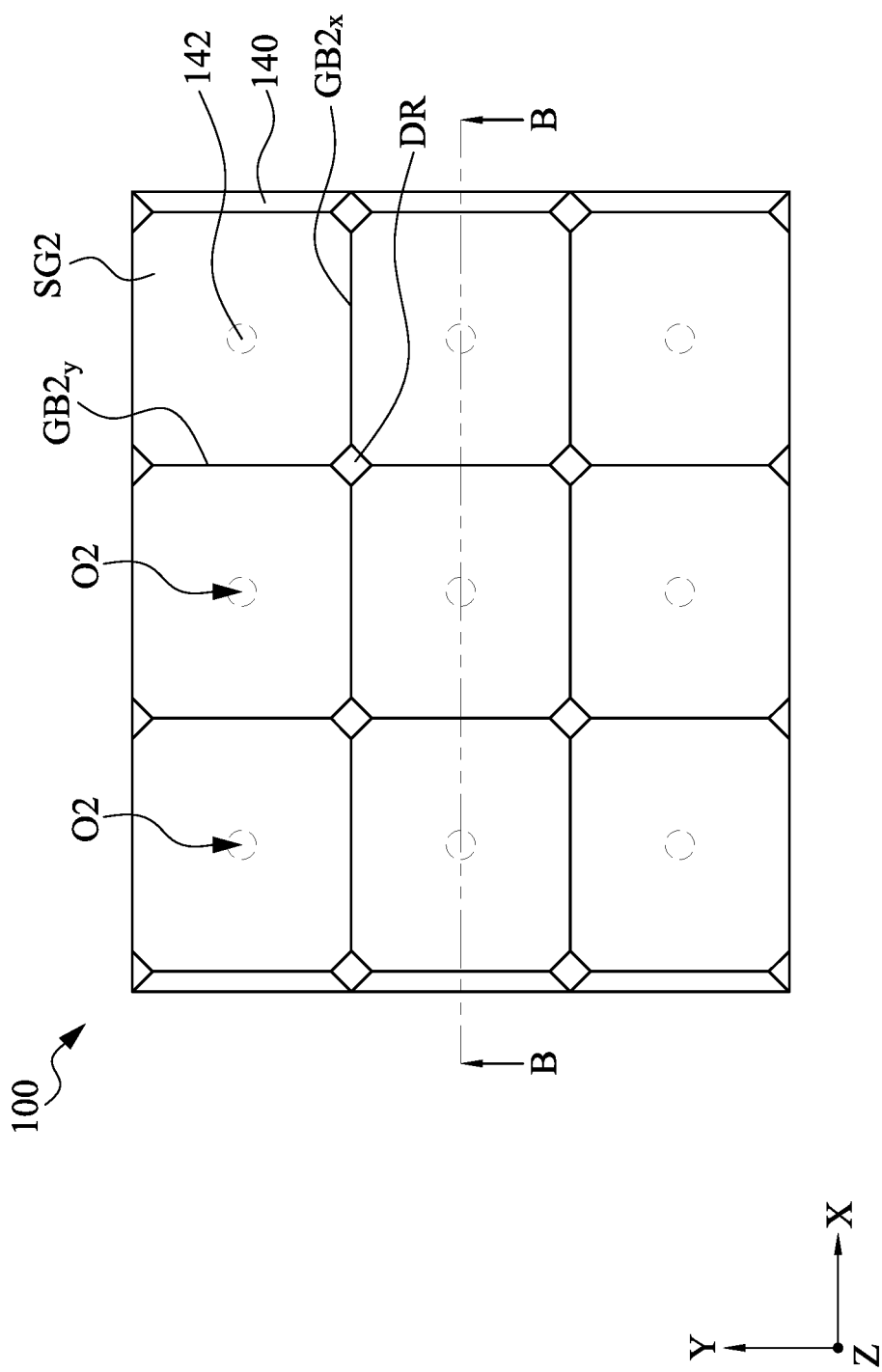
Figure 4B:
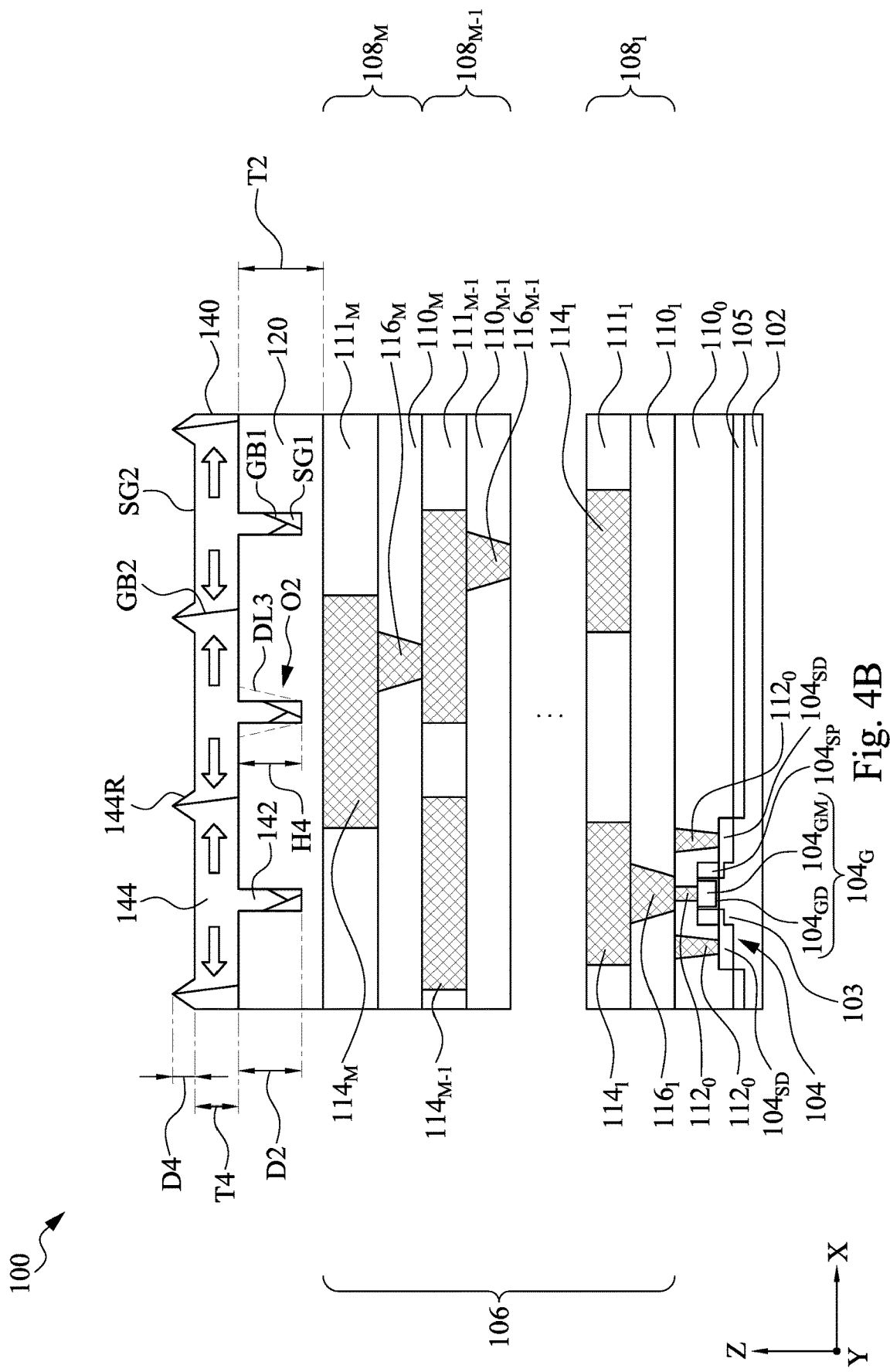

FIGS. 4A and 4B illustrate a polycrystalline silicon (interchangeably referred to as polysilicon or poly-Si) layer 140 formed by crystallization of the amorphous silicon layer 130 (as shown in FIGS. 3A and 3B), wherein FIG. 4A is a top view of the polysilicon layer 140, and FIG. 4B is a cross-sectional view taken along B-B line as shown in FIG. 4A. In some embodiments, crystallization of the amorphous silicon layer 130 can be performed using, for example, a laser anneal, a rapid thermal anneal (RTA), a millisecond anneal (mSA), the like or combinations thereof, which are performed at a temperature higher than deposition temperature of the amorphous silicon layer 130. In greater detail, the amorphous silicon layer 130 is heated to a temperature higher than a melting point of the amorphous silicon layer 130 to melt the amorphous silicon layer 130 into a molten state, and then the molten amorphous silicon will be crystallized into the polysilicon layer 140 upon cooling. The polysilicon layer 140 can be interchangeably referred to as a polycrystalline layer.

Example crystallization of the amorphous silicon layer 130 is performed by the laser anneal. The laser may be pulsed laser or a continuous wave laser that is directed toward a top surface of the amorphous silicon layer 130. Various lasers such as an XeCl or other excimer lasers may be used. The laser energy is adjusted to selectively melt amorphous silicon layer 130 but not intentionally melt the underlying materials (e.g., materials of the interconnect structure 106, the transistors 104 and/or the substrate 102). Various energies may be used and may depend upon the melting point of amorphous silicon layer 130. For a pulsed laser, the laser energy may further depend on the number and/or frequency of pulses used and the power density and energy are chosen in conjunction with the thickness of the amorphous silicon layer 130. The wavelength of laser light is chosen to be a wavelength that is absorbable by amorphous silicon and in an exemplary embodiment, a wavelength less than 11000 Å may be used. The pulsed laser causes the amorphous silicon layer 130 to substantially or completely melt while most or all underlying materials remain a solid material. The amorphous silicon layer 130 may be in its completely or substantially molten state from its top surface to its bottommost interface with the ILD layer 120. Because the bottommost interface between the amorphous silicon layer 130 and the ILD layer 120 is lower than a top surface of the ILD layer 120, at least upper portion of the ILD layer 120 may be unintentionally molten in order to completely melt the amorphous silicon layer 130.

After the laser anneal process, the molten amorphous silicon cools and thus starts to crystallize into polysilicon. During the cooling process, a heat dissipation rate in the ILD layer 120 decreases as a distance from the underlying interconnect structure 106 increases, because the interconnect structure 106 include multiple layers of metal lines and vias that dissipate heat at a faster rate than ambient gases above the ILD layer 120. Therefore, bottoms of the holes O2 in the ILD layer 120 have a faster heat dissipation rate than a top surface of the ILD 120 during the cooling operation. The heat dissipation rate difference thus results in a lower temperature at bottoms of the holes O2 in the ILD layer 120 than at the top surface of the ILD layer 120, which in turn initiates polysilicon nucleation almost only at the bottoms of the holes O2, rather than initiating polysilicon nucleation uniformly across the ILD layer 120. In some embodiments, the molten amorphous silicon can be reheated before spontaneous nucleation of polysilicon begins, which in turn can aid in initiating polysilicon nucleation at the bottoms of holes O2 in the ILD layer 120, because the spontaneous nucleation of polysilicon above the top surface of the ILD layer 120 can be suppressed by the reheating.

At an initial stage of the crystallization, multiple silicon grains SG1 grow upwardly from the bottoms of the holes O2, and grain boundaries GB1 formed by these silicon grains SG1 may terminate at sidewalls of the holes O2 (vertical or tapered sidewall as illustrated in FIG. 2B), which in turn result in only a single silicon grain SG2 grown beyond a single hole O2. These silicon grains SG2 grown beyond the respective holes O2 then grow laterally, as illustrated by the arrows in FIG. 4B, until neighboring grains SG2 meet to form grain boundaries GB2 above the ILD layer 120. Because the silicon grains GS2 are grown from respective holes O2 in the ILD layer 120, positions of the silicon grains SG2 depend on positions of the holes O2 in the ILD layer 120. Therefore, the positions of the silicon grains SG2 and hence the grain boundaries GB2 extending above the ILD layer 120 are predictable and controllable.

In this way, the silicon grains SG2 and grain boundaries GB2 can be formed on desired positions by designing the pattern of the holes O2. For example, the holes O2 arranged in rows and columns contribute to the silicon grains SG2 arranged in a grid pattern and spaced by X-directional grain boundaries $GB2_x$ and Y-directional grain boundaries $GB2_y$ when viewed from above, as illustrated in the top view of FIG. 4A. Moreover, the holes O2 are respectively located at centers of the silicon grains SG2 when viewed from above, because the silicon grains SG2 are respectively grown from the holes O2. These silicon grains SG2 can act as active regions on which active devices (e.g., transistors) will be formed, as described in greater detail below.

In some embodiments, as illustrated in FIG. 4A, the X-directional grain boundaries $GB2_x$ and Y-directional grain boundaries $GB2_y$ define silicon grains SG2 and crystal defect regions DR when viewed from above. The crystal defect regions DR may include crystallographic defects such as dislocations. In some embodiments, the silicon grains SG2 are larger than the crystal defect regions DR, and the silicon grains SG2 may be surrounded by a plurality of crystal defect regions DR. Further, as shown in FIG. 4A, silicon grains SG2 and crystal defect regions DR may be shaped as polygons having different shapes and/or numbers of sides when viewed from above. In some embodiments, the silicon grains SG2 may be defined by polygons having a greater number of sides than polygons defining crystal defect regions DR. For example, while silicon grains SG2 may be shaped as octagons, crystal defect regions DR may be shaped as quadrilaterals. However, silicon grains SG2 and crystal defect regions DR in other embodiments may be defined by polygons other than octagons or quadrilaterals or may include combinations of shapes including octagons or quadrilaterals in combination with one or more other type of polygon. Additionally, any number of silicon grains SG2 and crystal defect regions DR may include uniform shapes. Similarly, any number of silicon grains SG2 and crystal defect regions DR may exhibit non-uniform shapes. For example, in certain embodiments, both silicon grains SG2 and crystal defect regions DR may be defined with hexagons, pentagons, or polymers with irregular shapes. It is understood that shapes of the silicon grains SG2 and crystal defect regions DR can be determined by the pattern of the holes S2.

In some embodiments, the X-directional grain boundaries GB2$_x$ and Y-directional grain boundaries GB2$_y$ and the crystal defect regions DR will remain in a final IC product, but non-overlap with active devices (e.g., transistors) formed on the polysilicon layer 140 in a following step, because crystallographic defects in the grain boundaries and/or crystal defect regions may reduce performance of active devices to be formed on the polysilicon layer 140. In some other embodiments, the X-directional grain boundaries GB2$_x$ and Y-directional grain boundaries GB2$_y$ and the crystal defect regions DR will be removed.

As illustrated FIG. 4B, the polysilicon layer 140 includes polysilicon plug portions 142 extending in the holes O2 in the ILD layer 120, and a polysilicon lateral portion 144 extending along a top surface of the ILD layer 120. The polysilicon plug portions 142 each have grain boundaries GB1 terminating at sidewalls (vertical or tapered sidewalls) of the ILD layer 120, and the polysilicon lateral portion 144 has grain boundaries GB2 extending upwardly from the top surface of the ILD layer 120. In some embodiments, the horizontal polysilicon portion 144 may have raised regions 144R raised above a major surface of the horizontal polysilicon portion 144 by a non-zero distance D4. The grain boundaries GB2 are located at the raised regions 144R. For example, the grain boundaries GB2 extend upwardly from the top surface of the ILD layer 120 may terminate at topmost positions of the raised regions 144R. In some embodiments, the raised regions 144R may be removed using, for example, a CMP process.

Height H4 of the polysilicon plugs 142 is equal to the depth D2 of the holes O2 in the ILD layer 120, and thus is greater than half the thickness T2 of the ILD layer 120 but less than the thickness T2 of the ILD layer 120. Moreover, the height H4 of polysilicon plugs 142 is greater than the width of the polysilicon plugs 142. Thickness T4 of the polysilicon lateral portion 144 (i.e., vertical dimension from the major surface of the polysilicon lateral portion 144 to top surface of the ILD layer 120) can be less than, greater than, or equal to the height H4 of the polysilicon plugs 132. In some embodiments, the crystallization process may result in a ratio of the thickness T4 of the polysilicon lateral portion 144 to the non-zero distance D4 in a range from about 0.1 to about 1000.

In the depicted embodiments as shown in FIG. 4A, the polysilicon plugs 142 each have a round shape when viewed from above, because the polysilicon plugs 142 are formed in respective round holes O2. However, the round shape of plugs 142 is intended to be illustrative and is not intended to be limiting to embodiments of the present disclosure. For example, if the polysilicon plugs 142 are formed in square or rectangular holes O2' as illustrated in FIG. 2C, the polysilicon plugs 142 would have a square or rectangular shape when viewed from above. Moreover, if the square or rectangular holes O2' have sidewalls SW aligned with one or more desired crystallographic directions of the silicon cubic lattice, the silicon grains SG1 and/or SG2 may have controlled crystal lattice orientation, because the polysilicon nucleation initiates from the square or rectangular holes O2'. In some embodiments where the holes O2 in the ILD layer 120 have tapered sidewalls, as indicated by dash line DL1 illustrated in FIG. 2B, the polysilicon plugs 142 and the tapered sidewalls of the holes O2 may form tapered interfaces, as indicated by dash line DL3 illustrated in FIG. 4B.

Figure 5A:
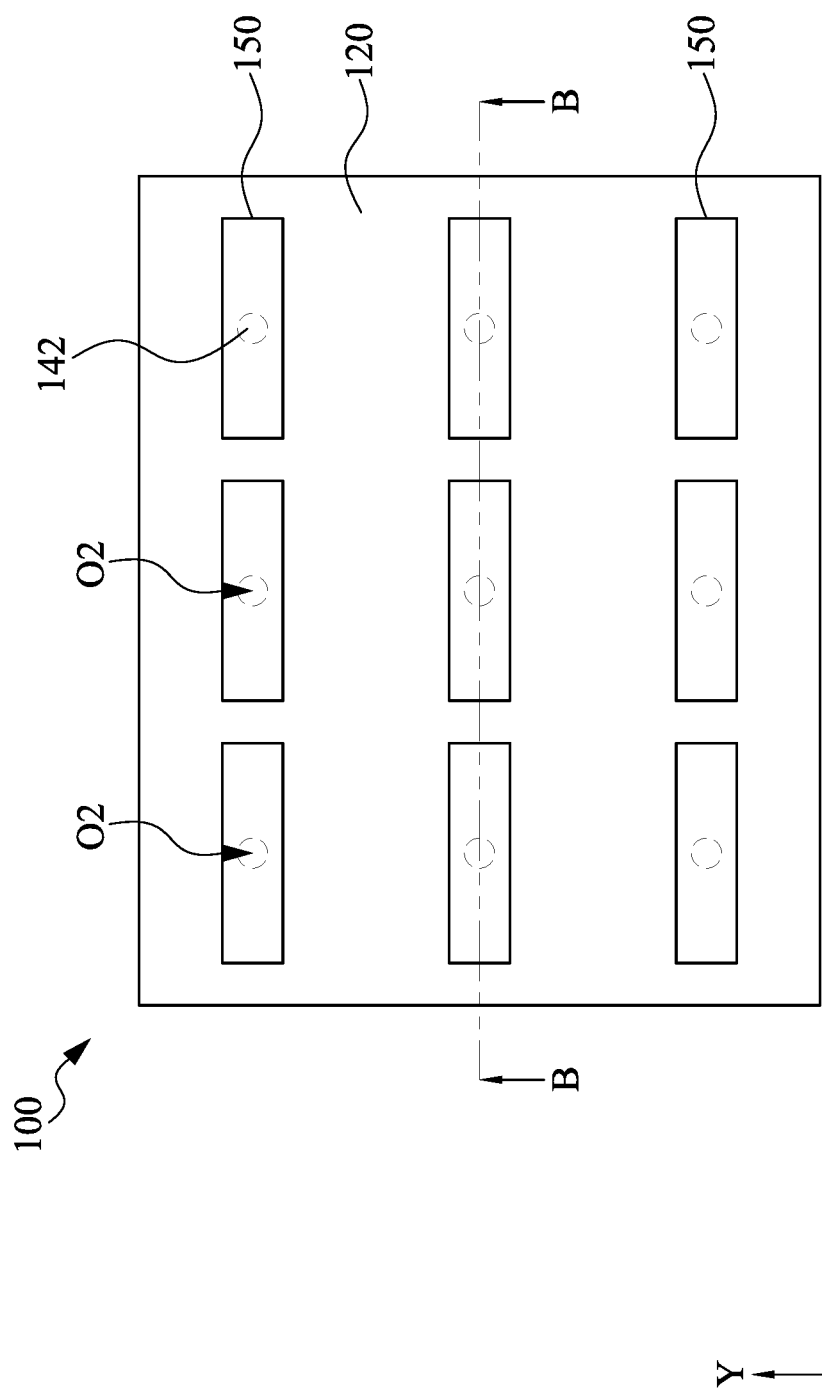
Figure 5B:
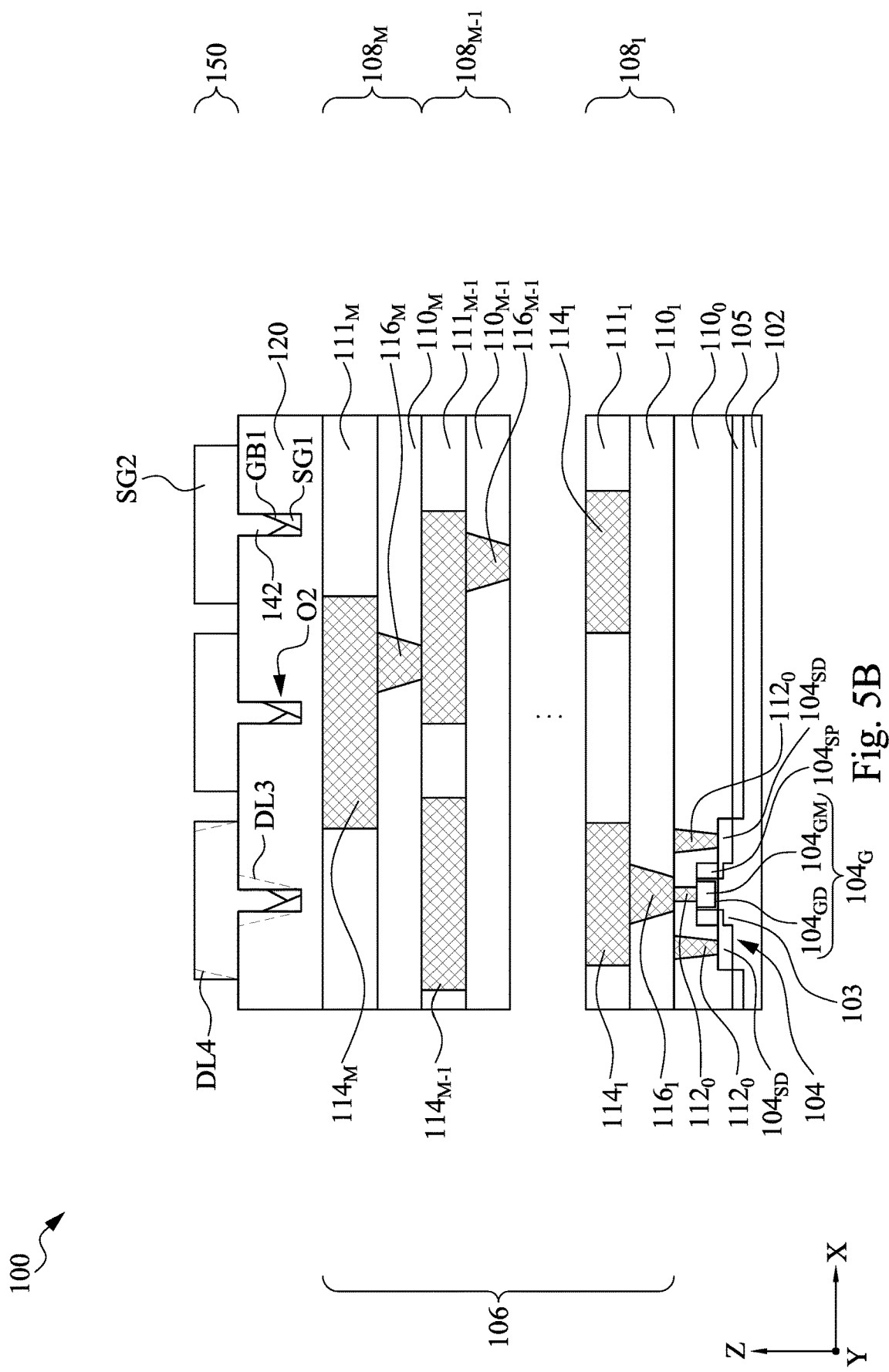

FIGS. 5A and 5B illustrate silicon fins (interchangeably referred to as silicon structures or semiconductor structures in the present disclosure) 150 formed on the ILD layer 120 by patterning the polysilicon layer 140, wherein FIG. 5A is a top view of the silicon fins 150, and FIG. 5B is a cross-sectional view taken along B-B line as shown in FIG. 5A. In greater detail, the silicon fins 150 may be formed by patterning the lateral portion 144 of the polysilicon layer 140 using suitable photolithography and etching techniques. For example, a photoresist (not shown) may be formed over the polysilicon layer 140 using a spin-on coating process, followed by patterning the photoresist to forming a plurality of holes using suitable photolithography techniques, and then the polysilicon layer 140 is etched using the patterned photoresist as an etch mask until the ILD layer 120 is exposed, thus resulting in silicon fins 150 extending along the top surface of the ILD layer 120. The polysilicon layer 140 can be patterned using, for example, hydroxide containing solution (e.g., ammonium hydroxide), deionized water, and/or other suitable solutions as an etchant.

In the embodiments shown in FIGS. 5A and 5B, grain boundaries GB2 and crystal defect regions DR as illustrated in FIG. 4A are etched away during patterning the polysilicon layer 140. As a result, the silicon fins 150 each are free of grain boundaries extending above the ILD layer 120, thus avoiding device performance degradation caused by forming channel, source and/or drain regions upon grain boundaries. After patterning the polysilicon layer 140, the polysilicon plug portions 142 still remain inlaid in the ILD layer 120, because the patterning process stops once the ILD layer 120 is exposed. Stated another way, the polysilicon lateral portion 144 is etched during the patterning process, while the polysilicon plug portions 142 remain substantially intact and thus still have grain boundaries GB1 within the holes O2 in the ILD layer 120. In the depicted embodiments, the polysilicon plug portions 142 are covered by the respective silicon fins 150 and thus extend from the respective silicon fins 150 into the ILD layer 120. In some other embodiments, the polysilicon plug portions 142 are not covered by the silicon fins 150. Stated another way, the silicon fins 150 may non-overlap the polysilicon plug portions 142.

Although the silicon fins illustrated in FIG. 5B have vertical sidewalls, the patterning process may lead to tapered sidewalls, as indicated by dash line DL4, in some other embodiments. In some embodiments where the silicon fins 150 are tapered fins and the polysilicon plug portions 142 are tapered plugs (as indicated by dash line DL3), the silicon fins 150 and the polysilicon plugs 142 may taper in opposite directions. For example, the silicon fins 150 taper in a direction away from the underlying interconnect structure 106, and the polysilicon plugs 142 taper in a direction toward the underlying interconnect structure 106. Stated another way, the silicon fins 150 may narrow as they extend away from the interconnect structure 106, and the polysilicon plugs 142 may narrow as they extend toward the interconnect structure 106. In other words, the silicon fins 150 have lengths and/or widths that may decrease as a distance from the interconnect structure 106 increases, and the polysilicon plugs 142 have widths that may increase as a distance from the interconnect structure 106 increases.

Figure 6A:
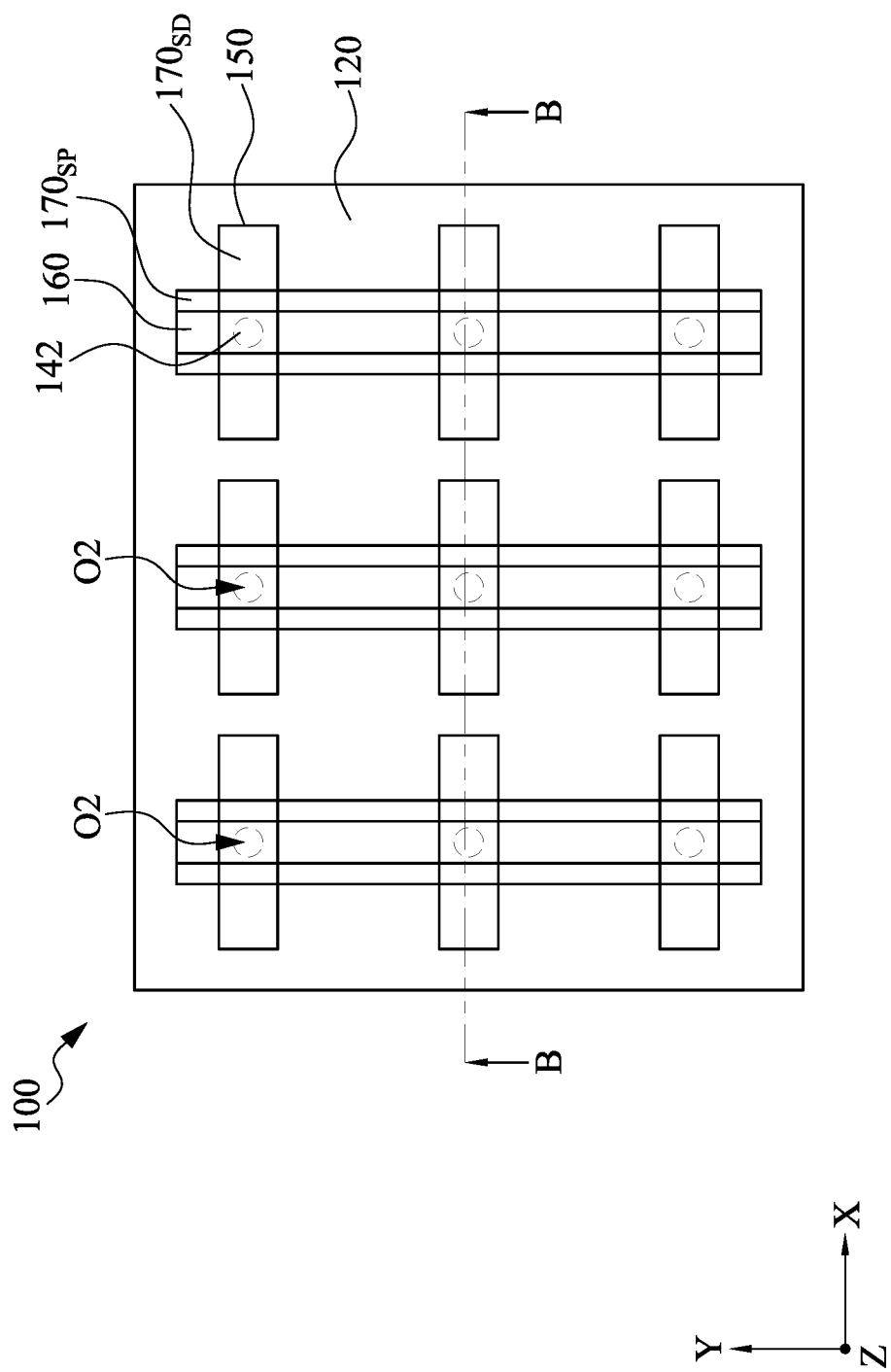
Figure 6B:
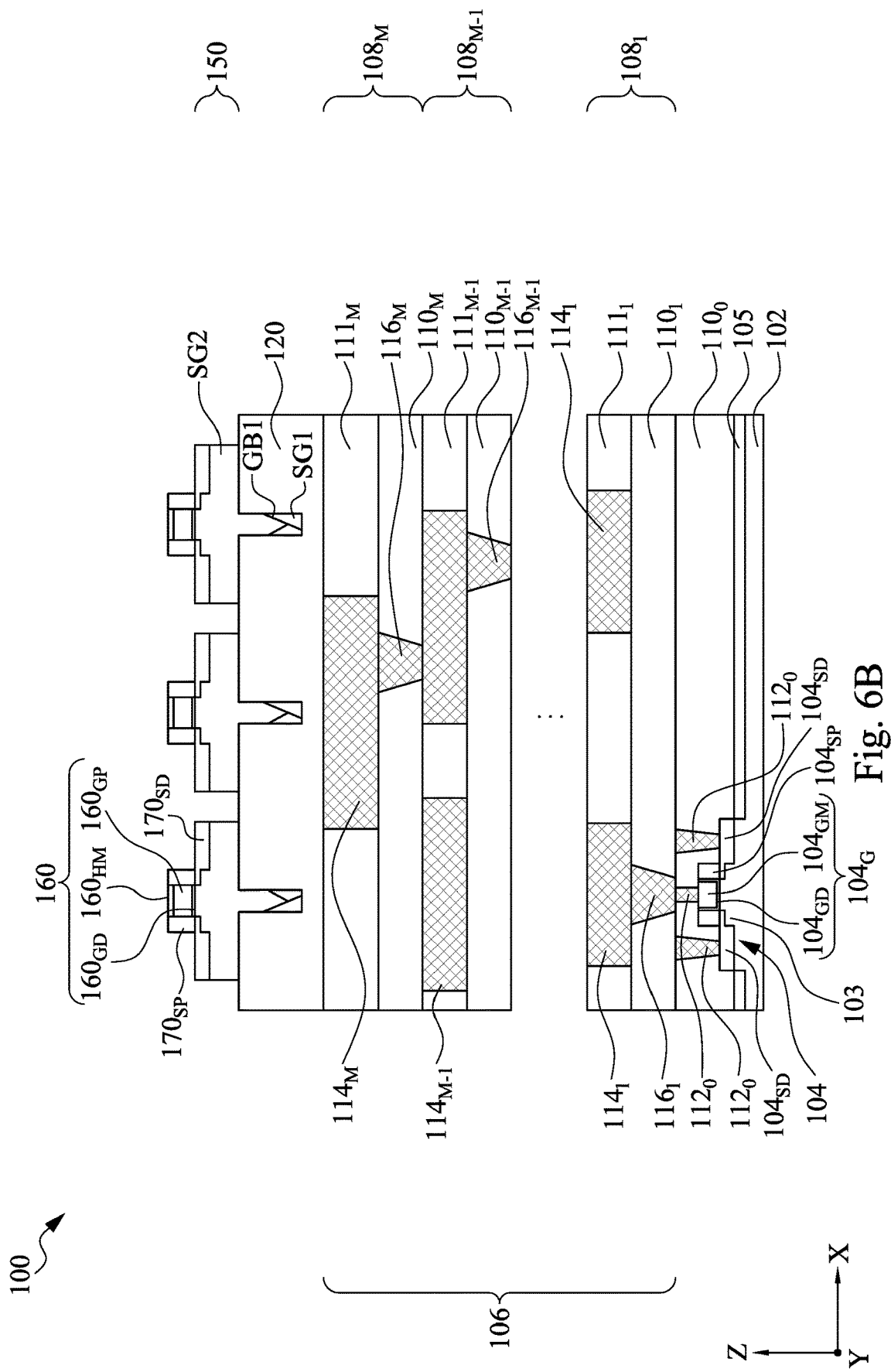

Once the silicon fins 150 are formed, dummy gate structures 160, gate spacers 170$_{SP}$, and source/drain regions 170$_{SD}$ are formed, without forming additional STI regions above the ILD layer 120, as illustrated in FIGS. 6A and 6B. This is because the silicon fins 150 are formed on the ILD layer 120 and thus can be insulated from each other by the ILD layer 120 without the need of additional STI regions. However, the STI-free fins 150 are intended to be illustrative and not intended to be limiting to embodiments of the present disclosure. In some other embodiments, additional STI regions may be formed around the fins 150 before forming the dummy gate structures 160, thus improving insulation between the fins 150.

In some embodiments, the dummy gate structure 160 may comprise a dummy gate dielectric $160_{GD}$, a dummy gate material $160_{GP}$, and a hard mask $160_{HM}$. First a dummy gate dielectric material (e.g., silicon oxide, silicon nitride, or the like) may be deposited. Next a dummy gate material (e.g., amorphous silicon, polysilicon, or the like) may be deposited over the dummy gate dielectric and then planarized (e.g., by CMP). A hard mask layer (e.g., silicon nitride, silicon carbide, or the like) may be formed over the dummy gate material and patterned into the hard masks $160_{HM}$. The dummy gate structures 160 are then formed by patterning the dummy gate dielectric and dummy gate material using the hard masks $160_{HM}$ as an etch mask. The materials used to form the dummy gate structures 160 may be deposited using any suitable method such as CVD, PECVD, ALD, (PEALD) or the like, or by thermal oxidation of the semiconductor surface, or combinations thereof. The resulting dummy gate structures 160 may extend across one or more silicon fins 105 over the top surface of the ILD layer 120, as illustrated in FIG. 6A. Moreover, the dummy gate structures 160 have longitudinal axes perpendicular to longitudinal axes of the silicon fins 150, as illustrated in FIG. 6A.

Source/drain regions $170_{SD}$ and spacers $170_{SP}$, illustrated in FIG. 6B, are formed, for example, self-aligned to the dummy gate structures 160. Spacers $170_{SP}$ may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers $170_{SP}$ along the sidewalls of the dummy gate structures 160 extending laterally onto portions of the surfaces of the silicon fins 150.

Source/drain regions $170_{SD}$ are semiconductor regions in direct contact with the silicon fins 105. In some embodiments, the source/drain regions $170_{SD}$ may comprise heavily-doped regions and relatively lightly-doped drain extensions, or LDD regions. Generally, the heavily-doped regions are spaced away from the dummy gate structures 160 using the spacers $170_{SP}$, whereas the LDD regions may be formed prior to forming spacers $170_{SP}$ and, hence, extend under the spacers $170_{SP}$ and, in some embodiments, extend further into portions of the silicon fins 150 below the dummy gate structures 160. The LDD regions may be formed, for example, by implanting dopants (e.g., As, P, B, In, or the like) using an ion implantation process.

The source/drain regions $170_{SD}$ may comprise an epitaxially grown region. For example, after forming the LDD regions, the spacers $170_{SP}$ may be formed and, subsequently, the heavily-doped source and drain regions may be formed self-aligned to the spacers $170_{SP}$ by first etching the fins to form recesses, and then depositing a crystalline semiconductor material in the recess by a selective epitaxial growth (SEG) process that may fill the recess and may extend further beyond the original surfaces of the silicon fins 150 to form raised source/drain epitaxy structures. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions $170_{SD}$ either in situ during SEG, or by an ion implantation process performed after the SEG, or by a combination thereof.

FIG. 7 illustrates an additional ILD layer 180 formed on the wafer 100. Once the source/drain regions $170_{SD}$ are formed, the ILD layer 180 is deposited over the source/drain regions $170_{SD}$. A planarization process (e.g., CMP) may be performed to remove excess ILD material and the hard mask $160_{HM}$ from over the dummy gate material $160_{GP}$ to form a top surface wherein the top surface of the dummy gate material is exposed and may be substantially coplanar with the top surface of the ILD layer 180. In some embodiments, a contact etch stop layer (CESL) (not shown) of a suitable dielectric (e.g., silicon nitride, silicon carbide, or the like, or a combination thereof) may be deposited prior to depositing the ILD material.

Figure 8:
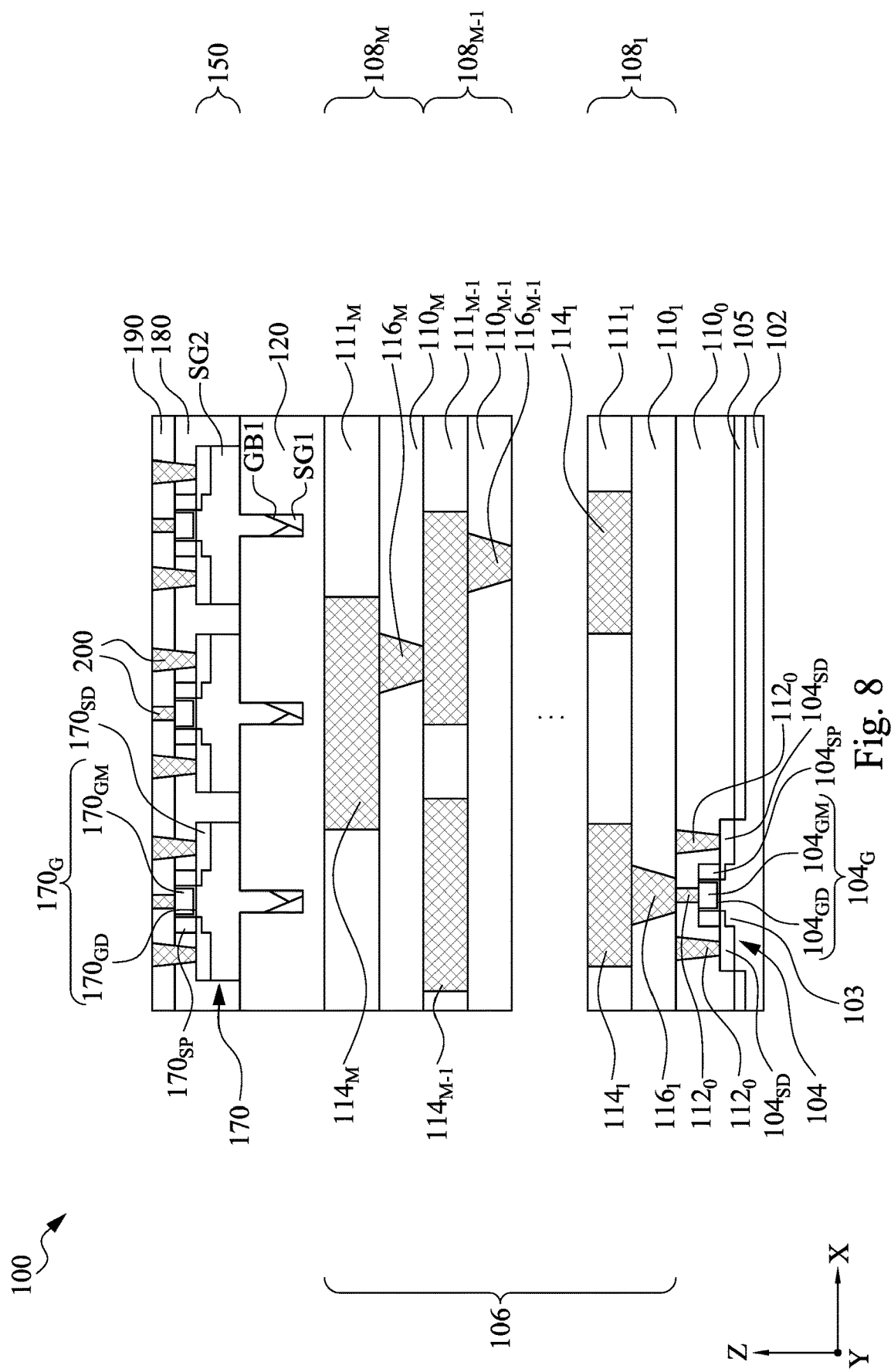

HKMG gate structures $170_G$, illustrated in FIG. 8, may then be formed by first removing the dummy gate structures 160 using one or more etching techniques, thereby creating recesses between respective spacers $170_{SP}$. Next, a replacement gate dielectric layer $170_{GD}$ comprising one more dielectrics, followed by a replacement gate metal layer $170_{GM}$ comprising one or more metals, are deposited to completely fill the recesses. Excess portions of the gate structure layers $170_{GD}$ and $170_{GM}$ may be removed from over the top surface of ILD layer 180 using, for example, a CMP process. The resulting HKMG gate structures $170_G$ may include remaining portions of the HKMG gate layers $170_{GD}$ and $170_{GM}$ inlaid between respective spacers $170_{SP}$.

The gate dielectric layer $170_{GD}$ includes similar materials as the gate dielectric layer $104_{GD}$ in the transistor 104 below the interconnect structure 106. For example, gate dielectric layer $170_{GD}$ includes a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the gate metal layer $170_{GM}$ includes similar materials as the gate metal layer $104_{GM}$ in the transistor 104 below the interconnect structure 106. For example the gate metal layer $104_{GM}$ may comprise a barrier layer, a work function layer, and a gate-fill layer formed successively on top of gate dielectric layer $170_{GD}$. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, ECP, electroless plating and/or the like.

After forming the HKMG structure $170_G$, another ILD layer 190 is deposited over the ILD layer 180. In some embodiments, materials of the ILD layers 180 and 190 may be similar as materials of one or more of the ILD layer $110_0$, and IMD layers $110_1$ to $110_M$ and $111_1$ to $111_M$ and thus are not repeated for the sake of brevity. The dielectric materials used to form the ILD layers 180 and 190 layer may be deposited using any suitable method, such as CVD, PVD, ALD, PEALD, PECVD, SACVD, FCVD, spin-on, and/or the like, or a combination thereof. Once the ILD layer 190 is formed, contacts 200 are formed in the ILD layers 180 and 190 to land on the gate structure $170_G$ and the source/drain regions $170_{SD}$, respectively. The contacts 200 are formed using photolithography, etching and deposition techniques as discussed previously with respect to the contacts 112$_O$, and have materials similar as the contacts 112$_O$, and thus manufacturing steps and materials of the contacts 200 are not repeated for the sake of brevity. After forming the contacts 200, another interconnect structure is formed over the contacts 200 using similar processes and materials as discussed previously with respect to the interconnect structure 106.

A HKMG structure 170$_G$, source/drain regions 170$_{SD}$ on opposite sides of the HKMG structure 170$_G$, and underlying portion of the silicon fin 150 together act as a transistor (e.g., a FinFET) 170 formed on the silicon fin 150. The transistors 170 above the interconnect structure 106 and the transistors 104 below the interconnect structure 106 can form an integrated circuit (IC). Because the IC includes transistors at different levels (e.g., transistors 170 at a higher level than transistors 104), it can be referred to as a three dimensional (3D) IC structure.

Figure 9:
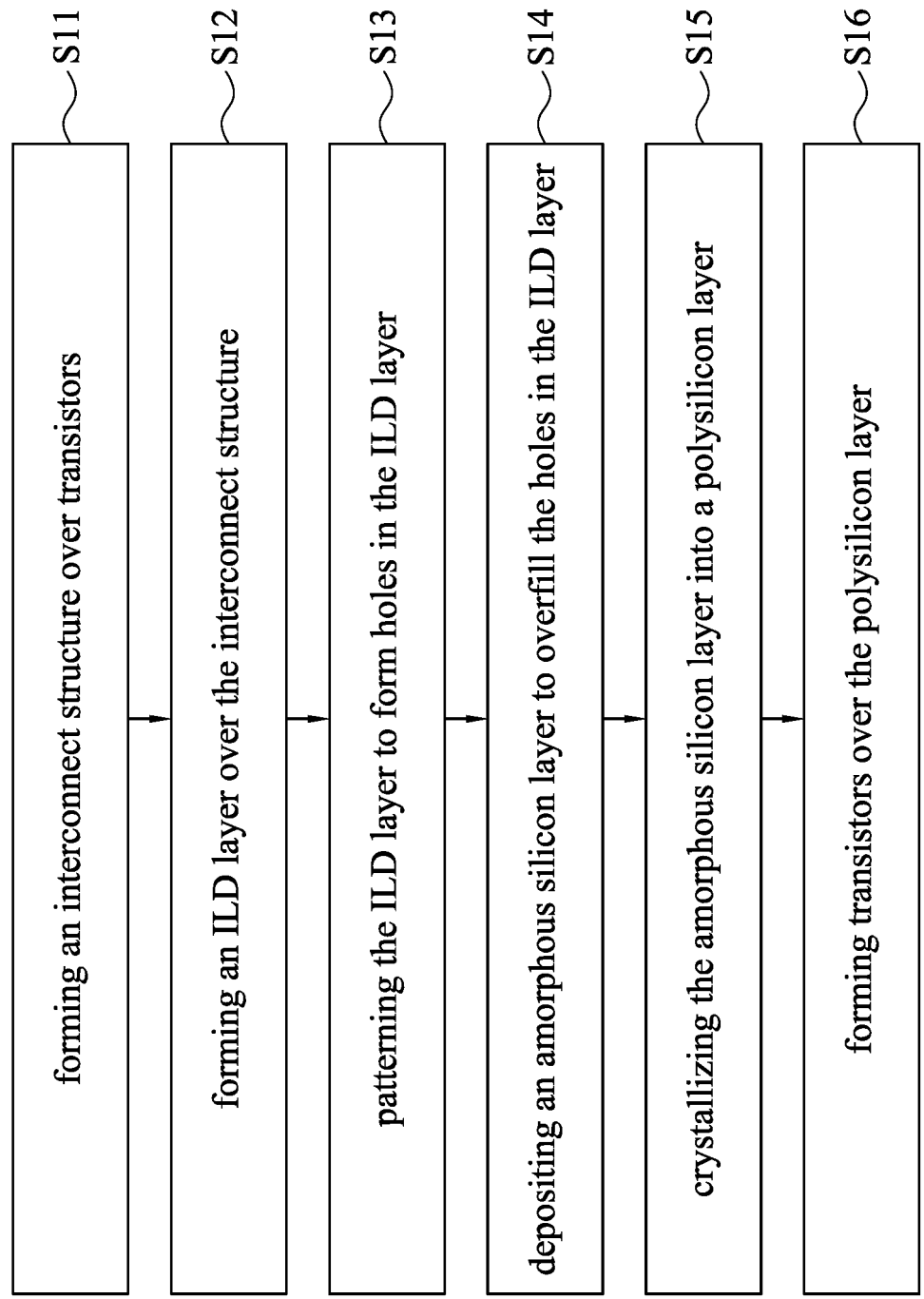
FIG. 9 illustrates a method M of forming a 3D IC in accordance with some embodiments.

FIG. 9 illustrates a method M of forming a 3D IC in accordance with some embodiments. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S11, an interconnect structure over transistors.

At block S12, an ILD layer is formed over the interconnect structure. FIGS. 1A and 1B respectively illustrate a top view and a cross-sectional view of some embodiments corresponding to acts in blocks S11 and S12.

At block S13, the ILD layer is patterned to form holes in the ILD layer using suitable photolithography and etching techniques. FIGS. 2A and 2B respectively illustrate a top view and a cross-sectional view of some embodiments corresponding to act in block S13.

At block S14, the amorphous silicon layer is deposited to overfill the holes in the ILD layer. FIGS. 3A and 3B respectively illustrate a top view and a cross-sectional view of some embodiments corresponding to act in block S14.

At block S15, the amorphous silicon layer is crystallized into a polysilicon layer. FIGS. 4A and 4B respectively illustrate a top view and a cross-sectional view of some embodiments corresponding to act in block S15.

At block S16, transistors are formed over the polysilicon layer. FIGS. 5A, 5B, 6A, 6B, 7 and 8 illustrate top views and cross-sectional views of some embodiments corresponding to act in block S16.

FIGS. 10-14 illustrate exemplary cross sectional views of various stages for manufacturing a 3D IC according to some other embodiments of the present disclosure. It is understood that additional operations can be provided before, during, and after processes shown by FIGS. 10-14, and some of the operations described below can be replaced or eliminated, for additional embodiments of the method. The order of the operations/processes may be interchangeable. The same or similar configurations, materials, processes and/or operation as described with FIGS. 1A-8 may be employed in the following embodiments, and the detailed explanation may be omitted.

Figure 10:
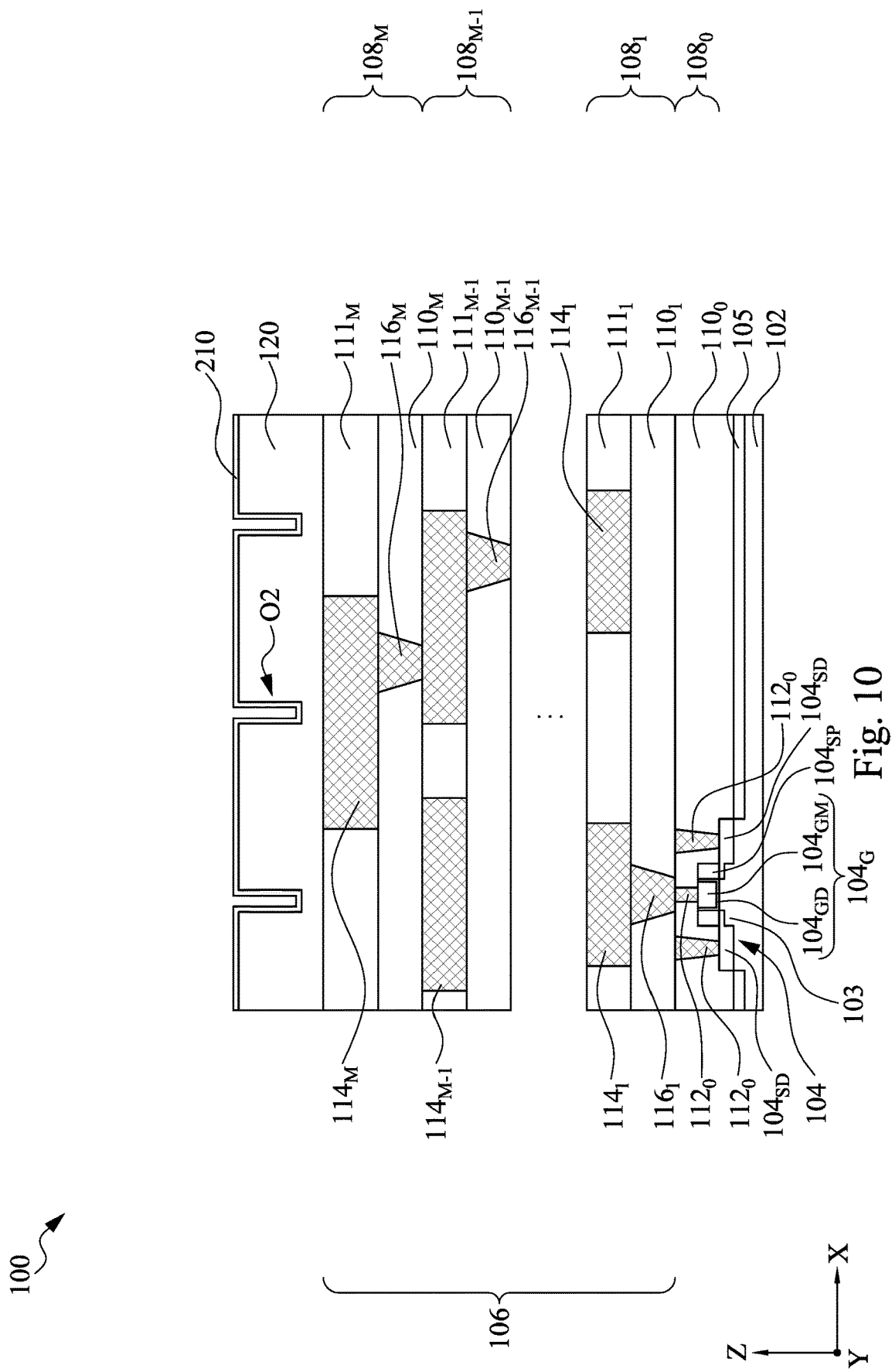
FIGS. 10-14 illustrate exemplary cross sectional views of various stages for manufacturing a 3D IC according to some other embodiments of the present disclosure.

After the structure as shown in FIGS. 2A-2B is formed, a spontaneous nucleation inhibition layer 210 is conformally deposited on the ILD layer 120, as illustrated in FIG. 10. A material of the spontaneous nucleation inhibition layer 210 is chosen in such a way that spontaneous nucleation of polysilicon can be suppressed compared with the case where no spontaneous nucleation inhibition layer 210 is formed. The spontaneous nucleation inhibition layer 210 can thus aid in initiating polysilicon nucleation at the bottoms of holes O2 in the ILD layer 120, because the spontaneous nucleation of polysilicon above the top surface of the ILD layer 120 is suppressed. In some embodiments, the spontaneous nucleation inhibition layer 210 includes, for example, silicon nitride (SiN), aluminum oxide (AlO) or other suitable materials that can suppress spontaneous nucleation of polysilicon. In some embodiments, the spontaneous nucleation inhibition layer 210 is formed using ALD, although other deposition techniques, such as CVD, PVA, PEALD, may be used.

Figure 11:
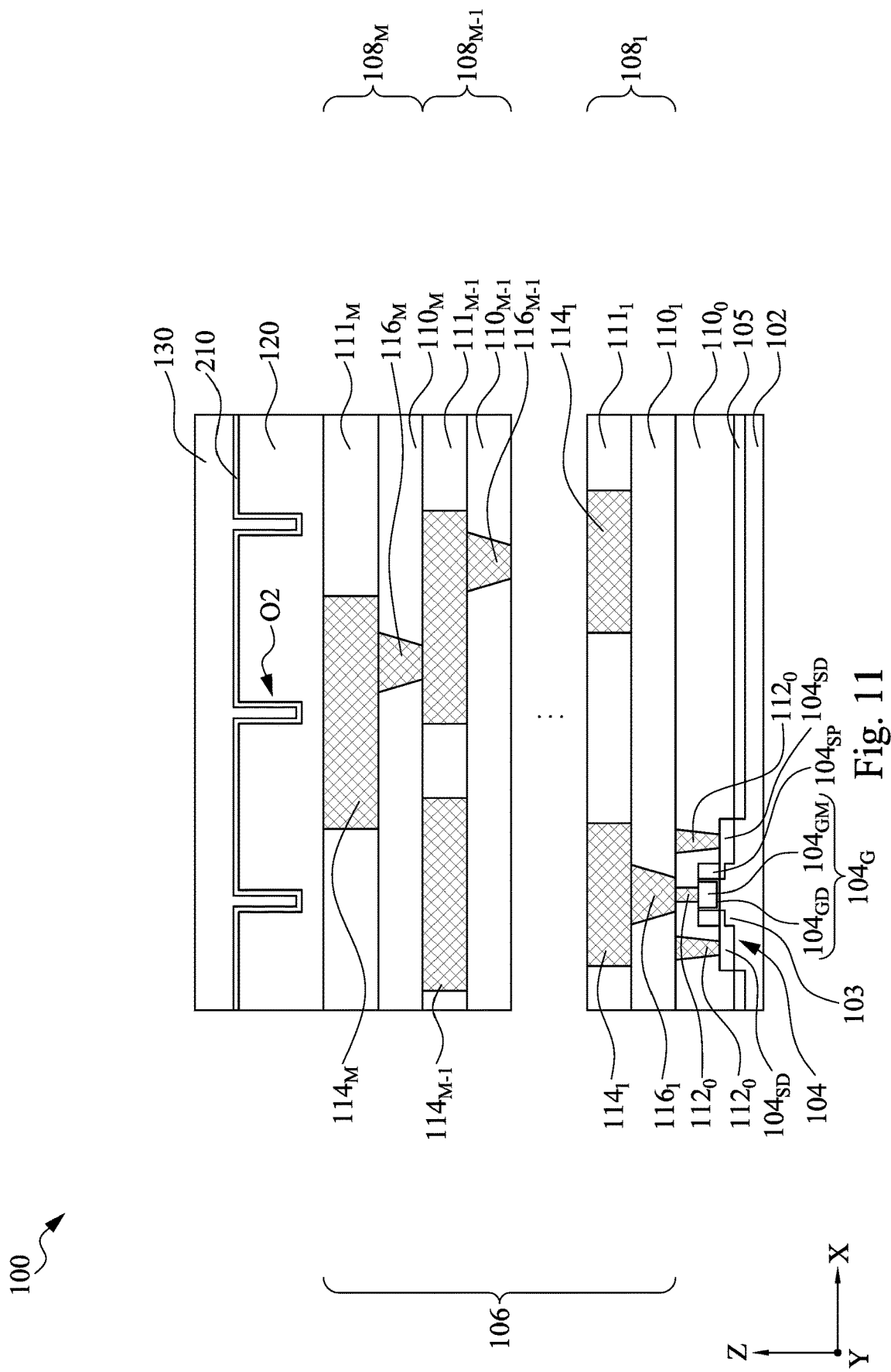

Afterwards, an amorphous silicon layer 130 is formed over the spontaneous nucleation inhibition layer 210 to fill the remainder of the holes O2 in the ILD layer 120, as illustrated in FIG. 11. Manufacturing processes and materials of the amorphous silicon layer 130 are similar to the descriptions with respect to FIGS. 3A and 3B, and thus are not repeated for the sake of brevity.

Figure 12:
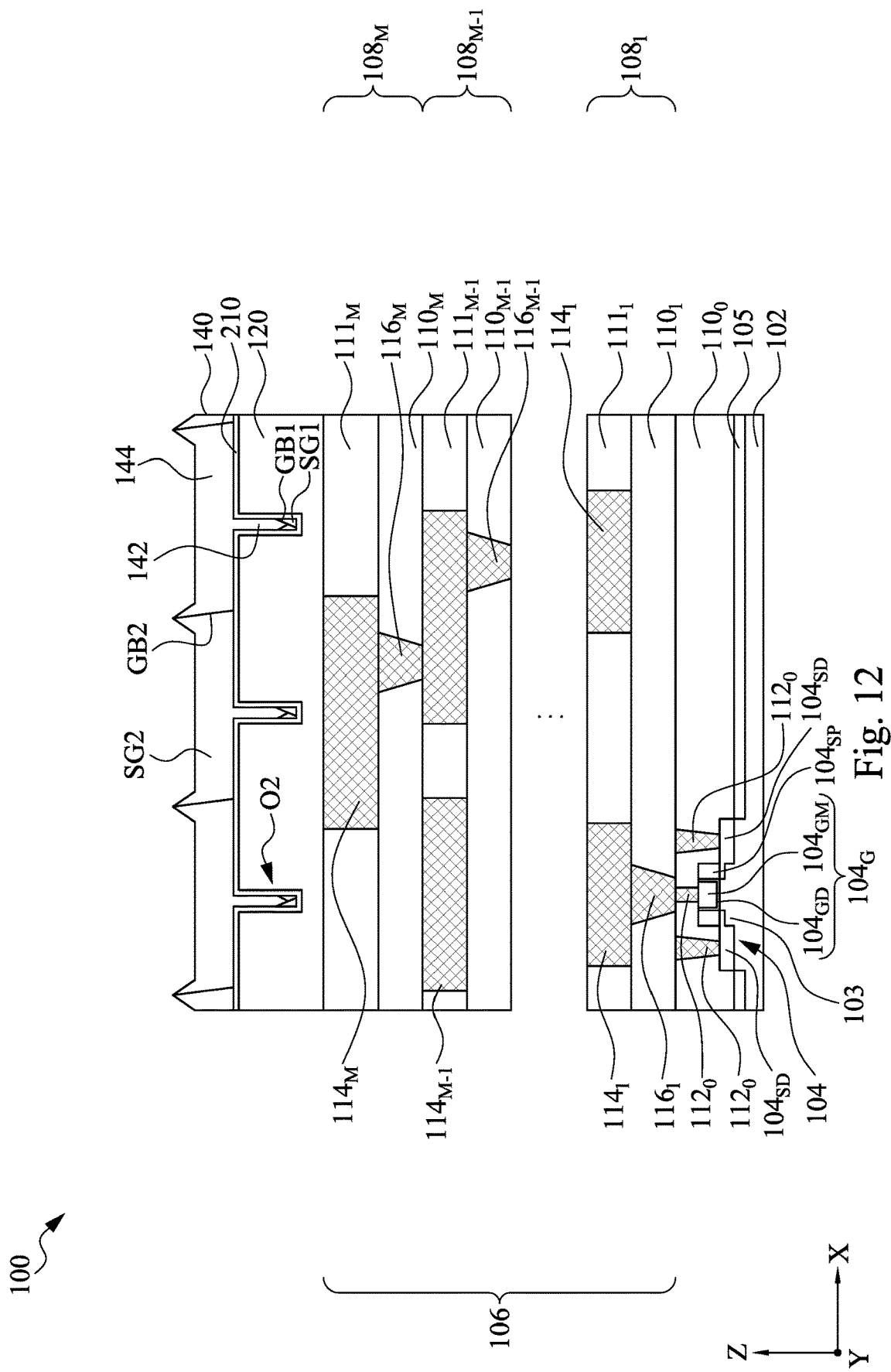

Thereafter, the amorphous silicon layer 130 is crystallized into a polysilicon layer 140, as illustrated in FIG. 12. The crystallization process is similar to the descriptions with respect to FIGS. 4A and 4B, and thus is not repeated for the sake of brevity.

Figure 13:
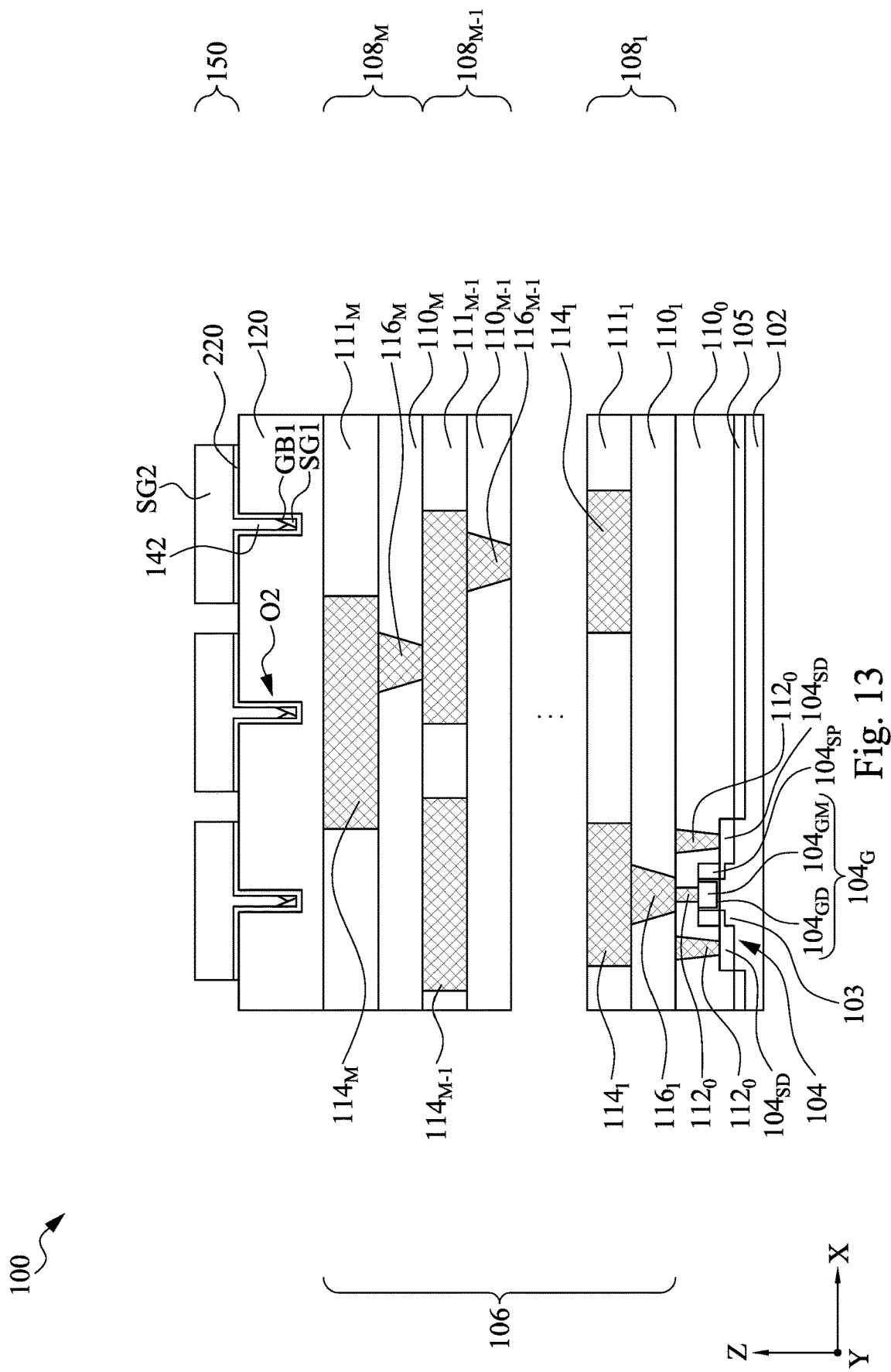

The polysilicon layer 140 is then patterned into silicon fins 150, as illustrated in FIG. 13. The patterning process is similar to the descriptions with respect to FIGS. 5A and 5B, and thus is not repeated for the sake of brevity. In some embodiments, the patterning process also patterns the spontaneous nucleation inhibition layer 210 into a plurality of spontaneous nucleation inhibition layers 220 underlying the respective silicon fins 150, thus resulting in sidewalls of the silicon fins 150 coterminous with end surfaces of the respective spontaneous nucleation inhibition layers 220. In some other embodiments, the patterning process does not pattern the spontaneous nucleation inhibition layer 210, and thus the spontaneous nucleation inhibition layer 210 remains as a blanket layer extending across the ILD layer 120.

Figure 14:
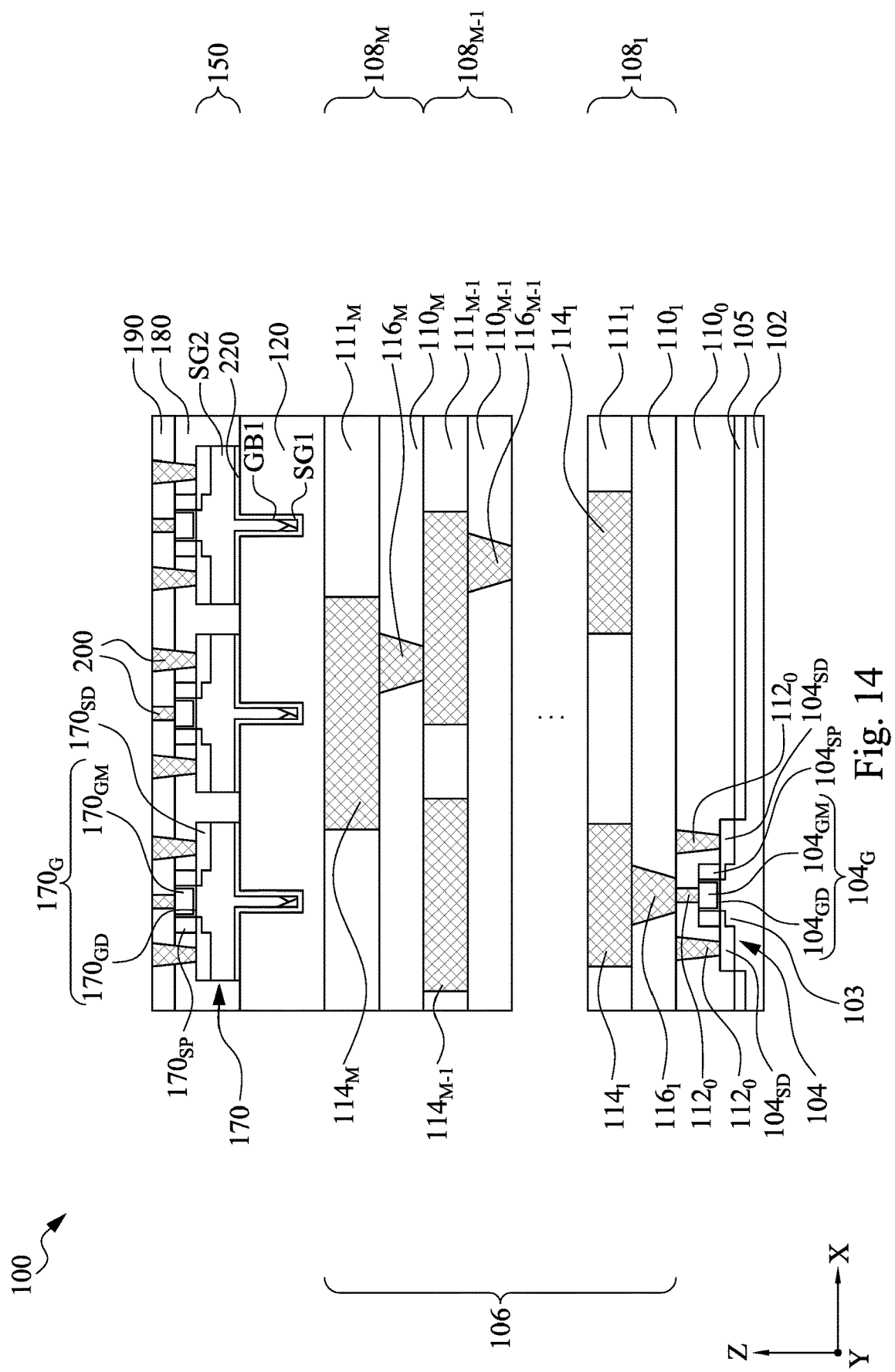

Afterwards, transistors 170 each including gate structure 170$_G$ and source/drain regions 170$_{SD}$ on opposite sides of the gate structure 170$_G$ are formed on the silicon fins 150. Contacts 200 are then formed to land on the gate structure 170$_G$ and source/drain regions 170$_{SD}$. The resulting structure is illustrated in FIG. 14. Formation of the transistors 170 and contacts 200 is similar to the descriptions with respect to FIGS. 6A-8, and thus is not repeated for the sake of brevity.

Figure 15:
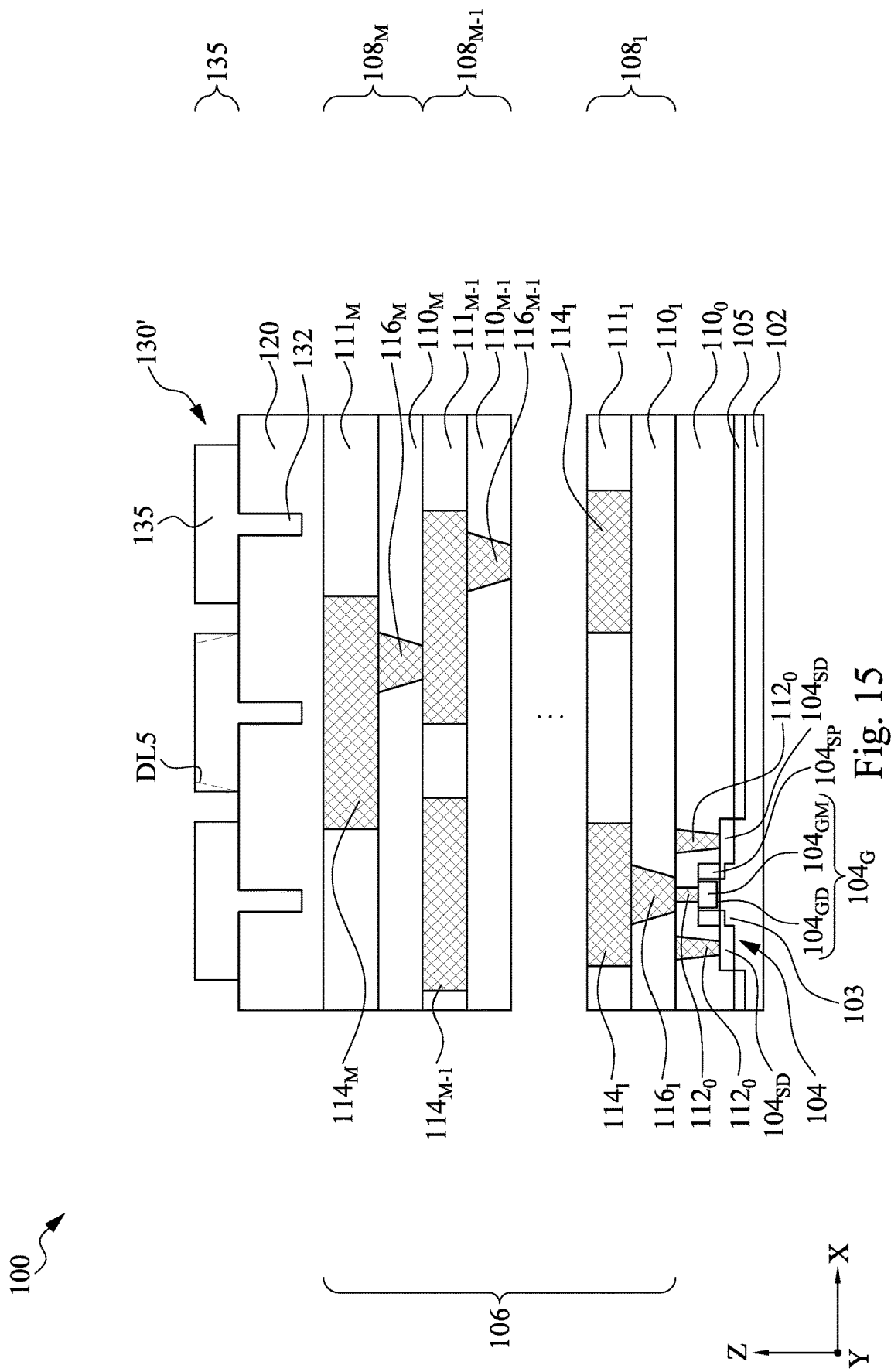
FIGS. 15-17 illustrate exemplary cross sectional views of various stages for manufacturing a 3D IC according to some other embodiments of the present disclosure.
Figure 16:
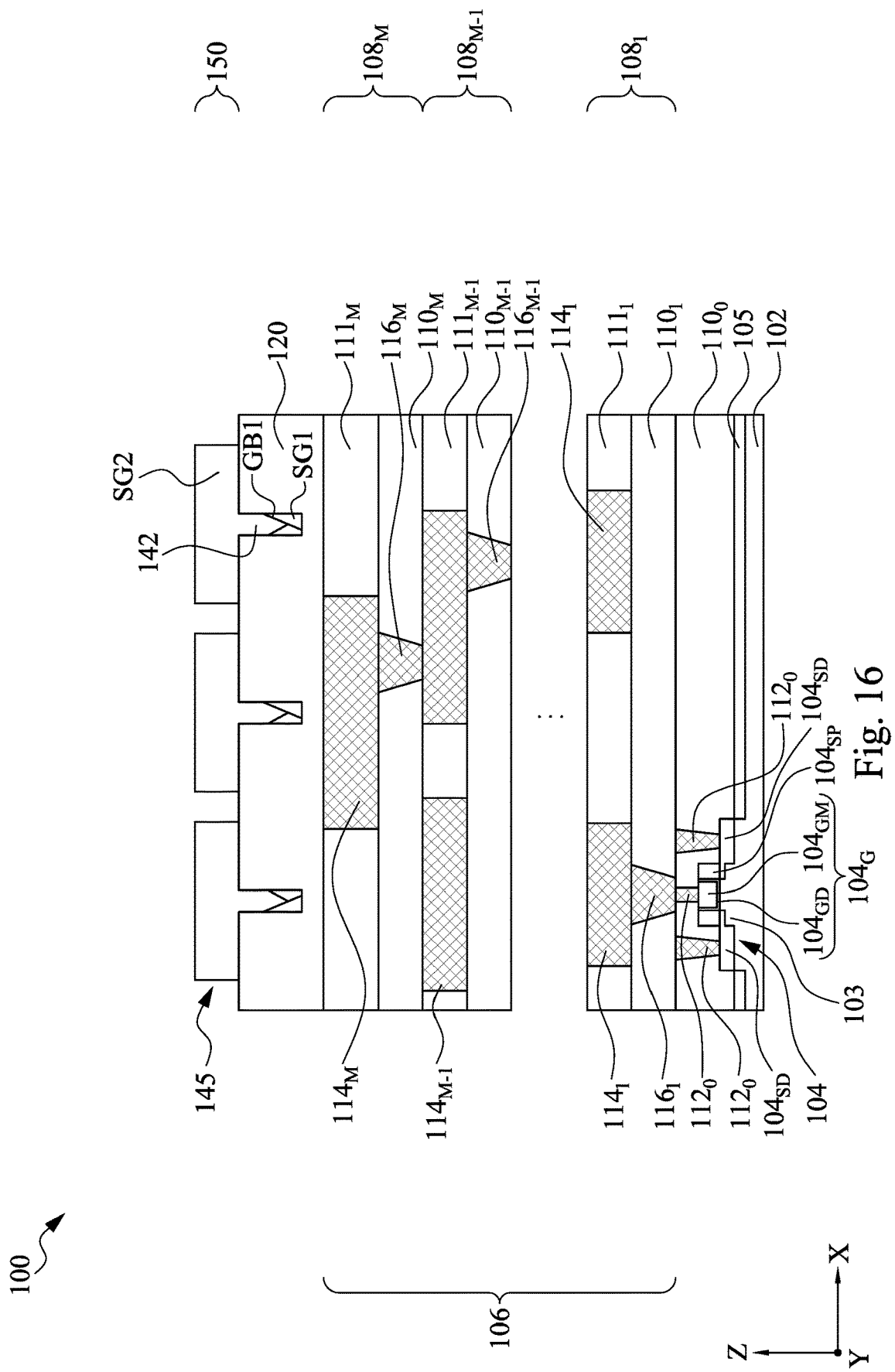
Figure 17:
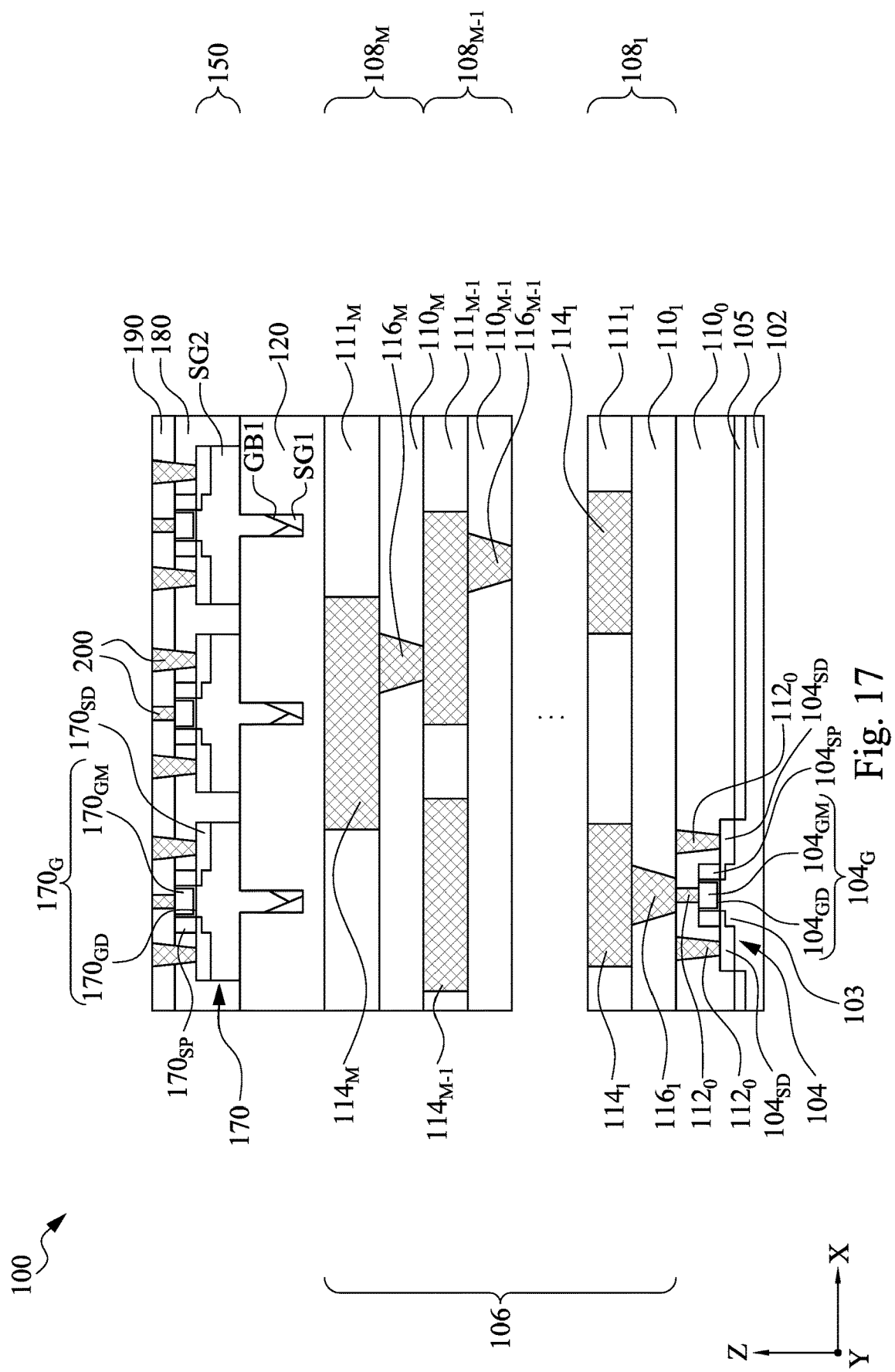

FIGS. 15-17 illustrate exemplary cross sectional views of various stages for manufacturing a 3D IC according to some other embodiments of the present disclosure. It is understood that additional operations can be provided before, during, and after processes shown by FIGS. 15-17, and some of the operations described below can be replaced or eliminated, for additional embodiments of the method. The order of the operations/processes may be interchangeable. The same or similar configurations, materials, processes and/or operation as described with FIGS. 1A-8 may be employed in the following embodiments, and the detailed explanation may be omitted.

After the structure as shown in FIGS. 3A and 3B is formed, the amorphous silicon layer 130 is patterned into a patterned amorphous silicon layer 130' that includes a plurality of amorphous silicon fins 135 having substantially same pattern as the silicon fins 150 as illustrated in FIGS. 5A and 5B. In this way, expected polysilicon grain boundary regions that are supposed to form in a following crystallization process are removed in advance. The patterning process may involve suitable photolithography and etching techniques. For example, a photoresist (not shown) may be formed over the amorphous silicon layer 130 using a spin-on coating process, followed by patterning the photoresist to forming a plurality of holes using suitable photolithography techniques, and then the amorphous silicon layer 130 is etched using the patterned photoresist as an etch mask until the ILD layer 120 is exposed, thus resulting in amorphous silicon fins 135 extending along the top surface of the ILD layer 120.

After patterning the amorphous silicon layer 130, the amorphous silicon plug portions 132 still remain inlaid in the ILD layer 120, because the patterning process stops once the ILD layer 120 is exposed. Stated another way, the amorphous silicon lateral portion 134 (as illustrated in FIG. 3B) is etched during the patterning process, while the amorphous silicon plug portions 132 remain substantially intact within the holes O2 in the ILD layer 120. In the depicted embodiments, the amorphous silicon plug portions 132 are covered by the respective amorphous silicon fins 135 and thus extend from the respective amorphous silicon fins 135 into the ILD layer 120. In some other embodiments, the amorphous silicon plug portions 132 are not covered by the amorphous silicon fins 135. Stated another way, the amorphous silicon fins 135 may non-overlap the amorphous silicon plug portions 132.

Although the amorphous silicon fins 135 illustrated in FIG. 15 have vertical sidewalls, the patterning process may lead to tapered sidewalls, as indicated by dash line DL5, in some other embodiments. In some embodiments where the amorphous silicon fins 135 are tapered fins and the amorphous silicon plug portions 132 are tapered plugs, the amorphous silicon fins 135 and the amorphous silicon plugs 132 may taper in opposite directions. For example, the amorphous silicon fins 135 taper in a direction away from the underlying interconnect structure 106, and the amorphous silicon plugs 132 taper in a direction toward the underlying interconnect structure 106.

Thereafter, the patterned amorphous silicon layer 130' is crystallized into a patterned polysilicon layer 145 having silicon fins 150 and polysilicon plug portions 142 extending in the ILD layer 120, as illustrated in FIG. 16. Because expected polysilicon grain boundary regions have been removed in advance, the crystallization process may not form grain boundaries extending above the ILD layer 120. The crystallization process is similar to the descriptions with respect to FIGS. 4A and 4B, and thus is not repeated for the sake of brevity.

Afterwards, transistors 170 each including gate structure $170_G$ and source/drain regions $170_{SD}$ on opposite sides of the gate structure $170_G$ are formed on the silicon fins 150. Contacts 200 are then formed to land on the gate structure $170_G$ and source/drain regions $170_{SD}$. The resulting structure is illustrated in FIG. 17. Formation of the transistors 170 and contacts 200 is similar to the descriptions with respect to FIGS. 6A-8, and thus is not repeated for the sake of brevity.

Figure 18:
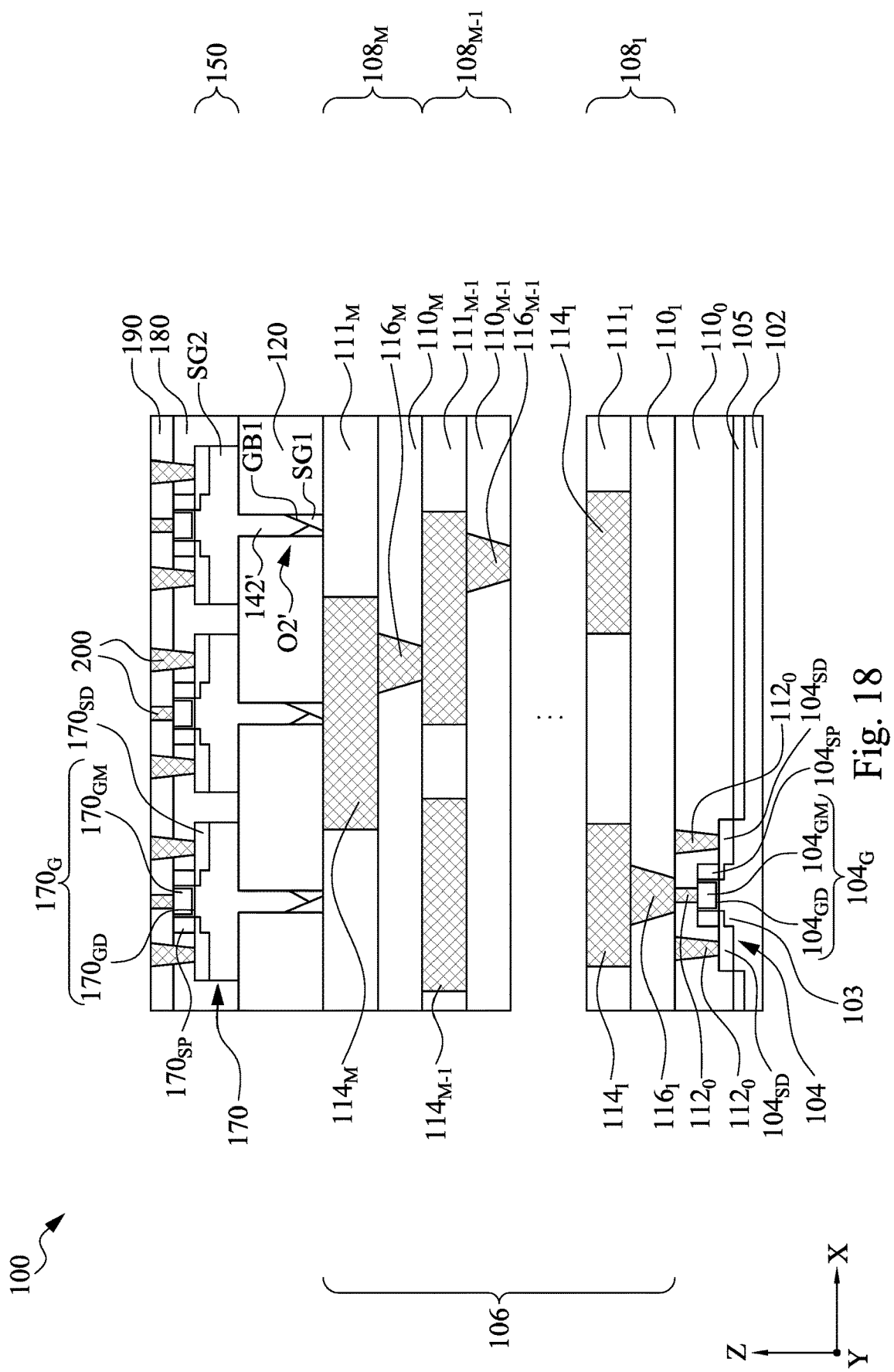
FIG. 18 illustrates an exemplary cross sectional view of a 3D IC according to some other embodiments of the present disclosure.

FIG. 18 illustrates an exemplary cross sectional view of a 3D IC according to some other embodiments of the present disclosure. FIG. 18 shows substantially the same structure as FIG. 8, except that holes O2' and the polysilicon plug portions 142' in the holes O2' extend through the entire ILD layer 120 to reach the underlying interconnect structure 106. The heat dissipation rate at bottoms of the holes O2' is thus further improved, thus aiding in initiating polysilicon nucleation from the bottoms of the holes. The 3D IC as shown in FIG. 18 can be formed using the process flow as shown in FIG. 9, wherein the patterning process at block S13 is performed until the interconnect structure is exposed at holes in the ILD layer.

Figure 19:
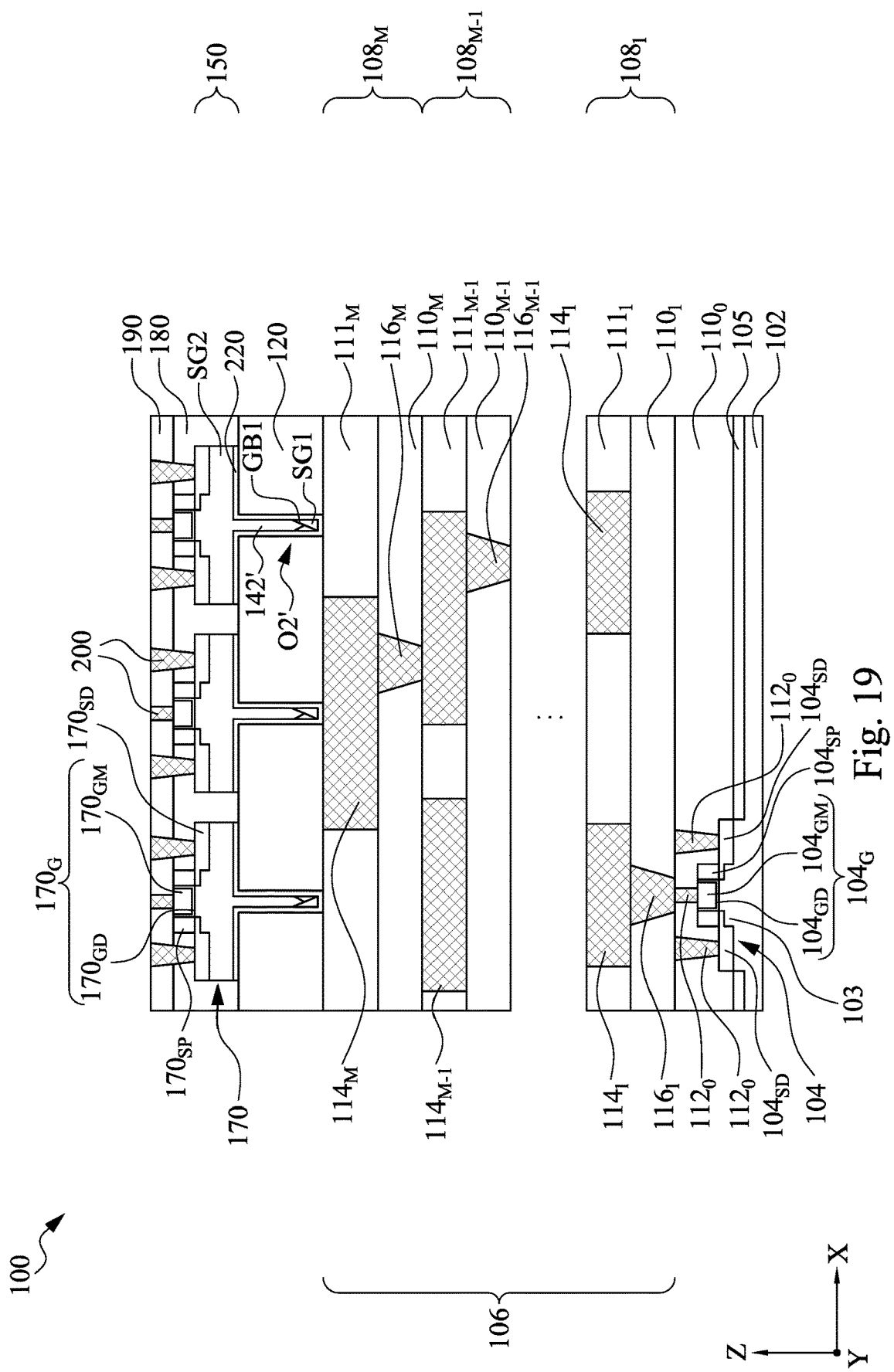
FIG. 19 illustrates an exemplary cross sectional view of a 3D IC according to some other embodiments of the present disclosure.

FIG. 19 illustrates an exemplary cross sectional view of a 3D IC according to some other embodiments of the present disclosure. FIG. 19 shows substantially the same structure as FIG. 18, except for the addition of spontaneous nucleation inhibition layers 220 that extend below respective silicon fins 150 and polysilicon plug portions 142'. The spontaneous nucleation inhibition layers 220 line the respective holes O2' in the ILD layer 120 and the top surface of the ILD layer 120, and can suppress spontaneous nucleation of polysilicon as discussed previously with respect to FIGS. 10-12. The 3D IC as shown in FIG. 19 can be formed using the process flow as shown in FIG. 9, wherein the patterning process at block S13 is performed until the interconnect structure is exposed at holes in the ILD layer, and then a spontaneous nucleation inhibition layer is deposited upon the ILD layer before the amorphous silicon deposition at block S14.

Figure 20:
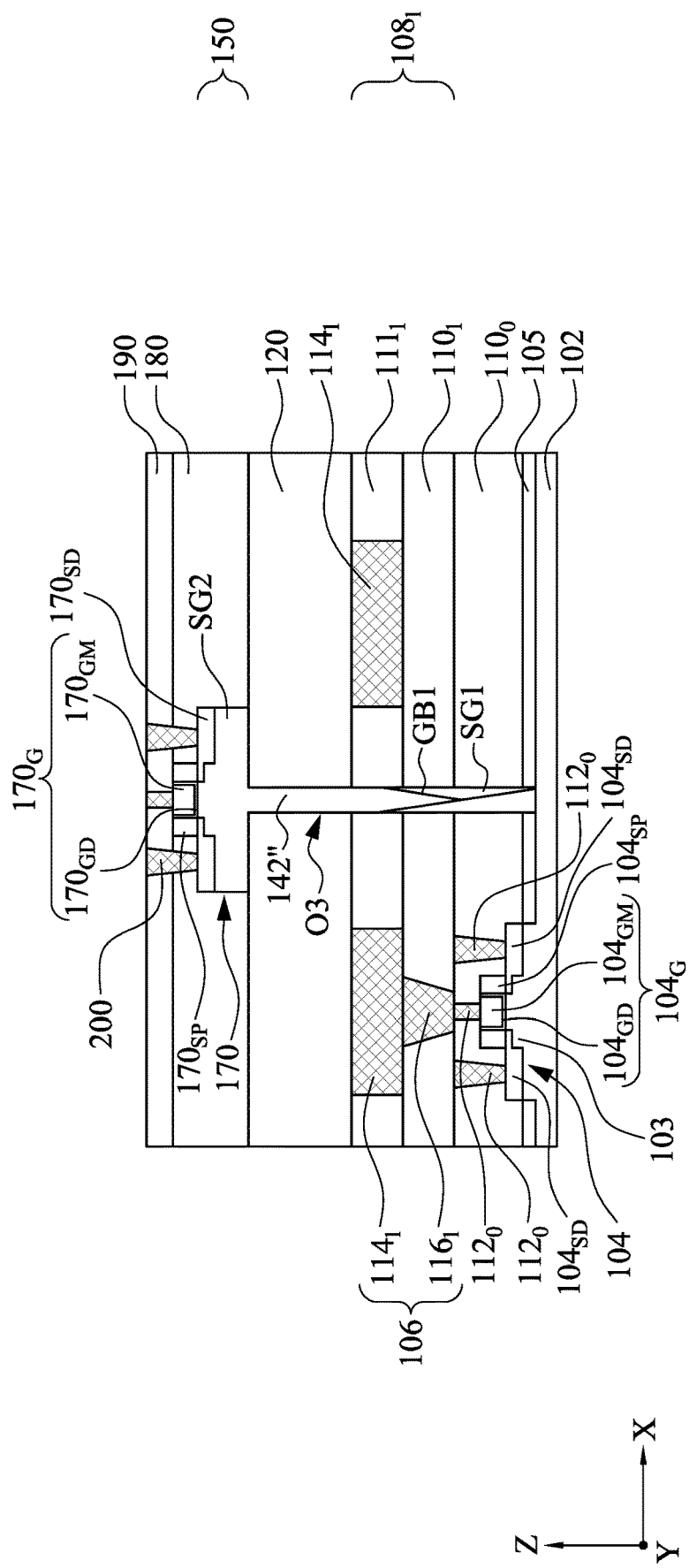
FIG. 20 illustrates an exemplary cross sectional view of a 3D IC according to some other embodiments of the present disclosure.

FIG. 20 illustrates an exemplary cross sectional view of a 3D IC according to some other embodiments of the present disclosure. FIG. 20 shows substantially the same structure as FIG. 8, except that holes O3 and the polysilicon plug portions 142" in the holes O3 extend through the ILD layer 120, IMD layers in the interconnect structure 106, the ILD layer $110_O$, and the STI region 105 to reach the underlying semiconductor substrate 102. The heat dissipation rate at bottoms of the holes O3 is thus further improved, thus aiding in initiating polysilicon nucleation from the bottoms of the holes. The 3D IC as shown in FIG. 20 can be formed using the process flow as shown in FIG. 9, wherein the patterning process at block S13 is performed until the semiconductor substrate is exposed at the resulting holes.

Figure 21:
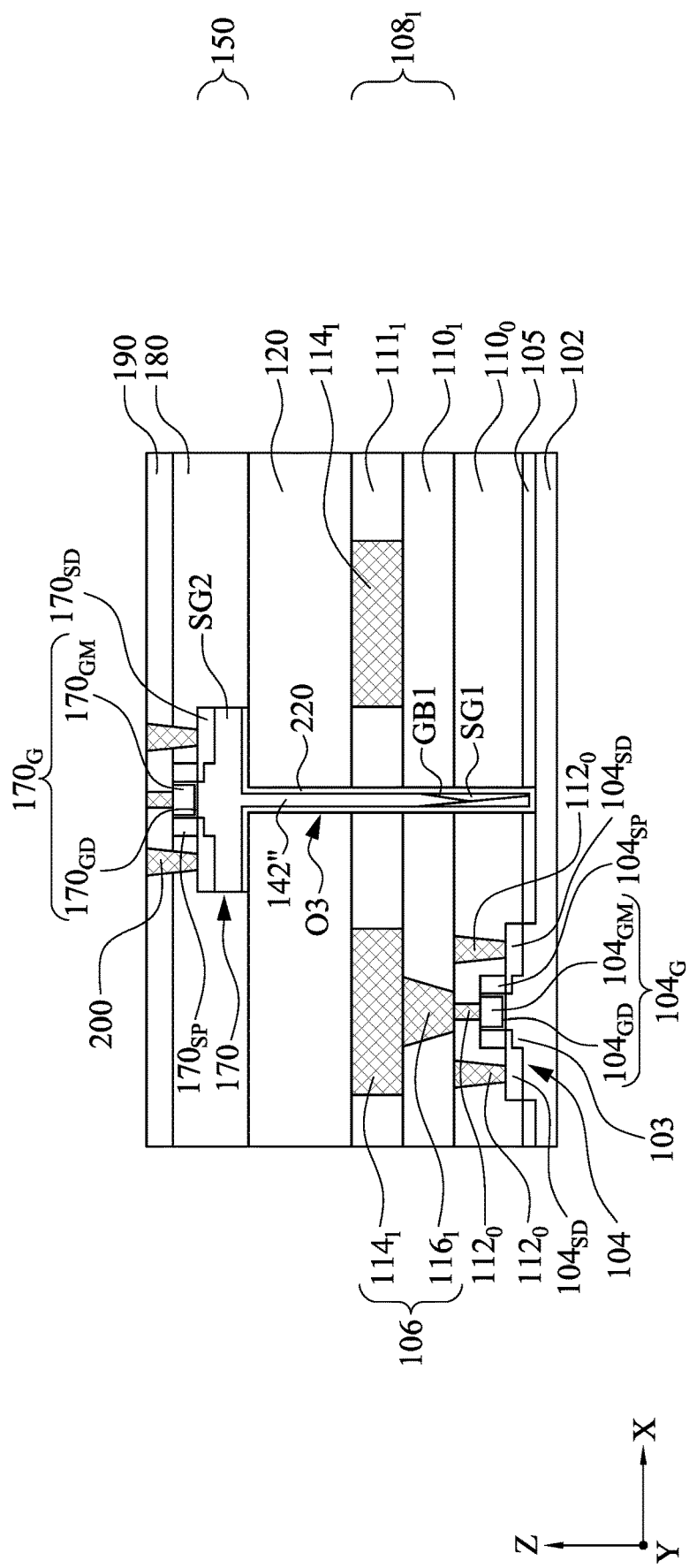
FIG. 21 illustrates an exemplary cross sectional view of a 3D IC according to some other embodiments of the present disclosure.

FIG. 21 illustrates an exemplary cross sectional view of a 3D IC according to some other embodiments of the present disclosure. FIG. 21 shows substantially the same structure as FIG. 20, except for the addition of spontaneous nucleation inhibition layers 220 that extend below respective silicon fins 150 and polysilicon plug portions 142". The spontaneous nucleation inhibition layers 220 line the respective holes O3 and the top surface of the ILD layer 120, and can suppress spontaneous nucleation of polysilicon as discussed previously with respect to FIGS. 10-12. The 3D IC as shown in FIG. 21 can be formed using the process flow as shown in FIG. 9, wherein the patterning process at block S13 is performed until the semiconductor substrate is exposed at resulting holes, and then a spontaneous nucleation inhibition layer is deposited upon the ILD layer before the amorphous silicon deposition at block S14.

Figure 22A:
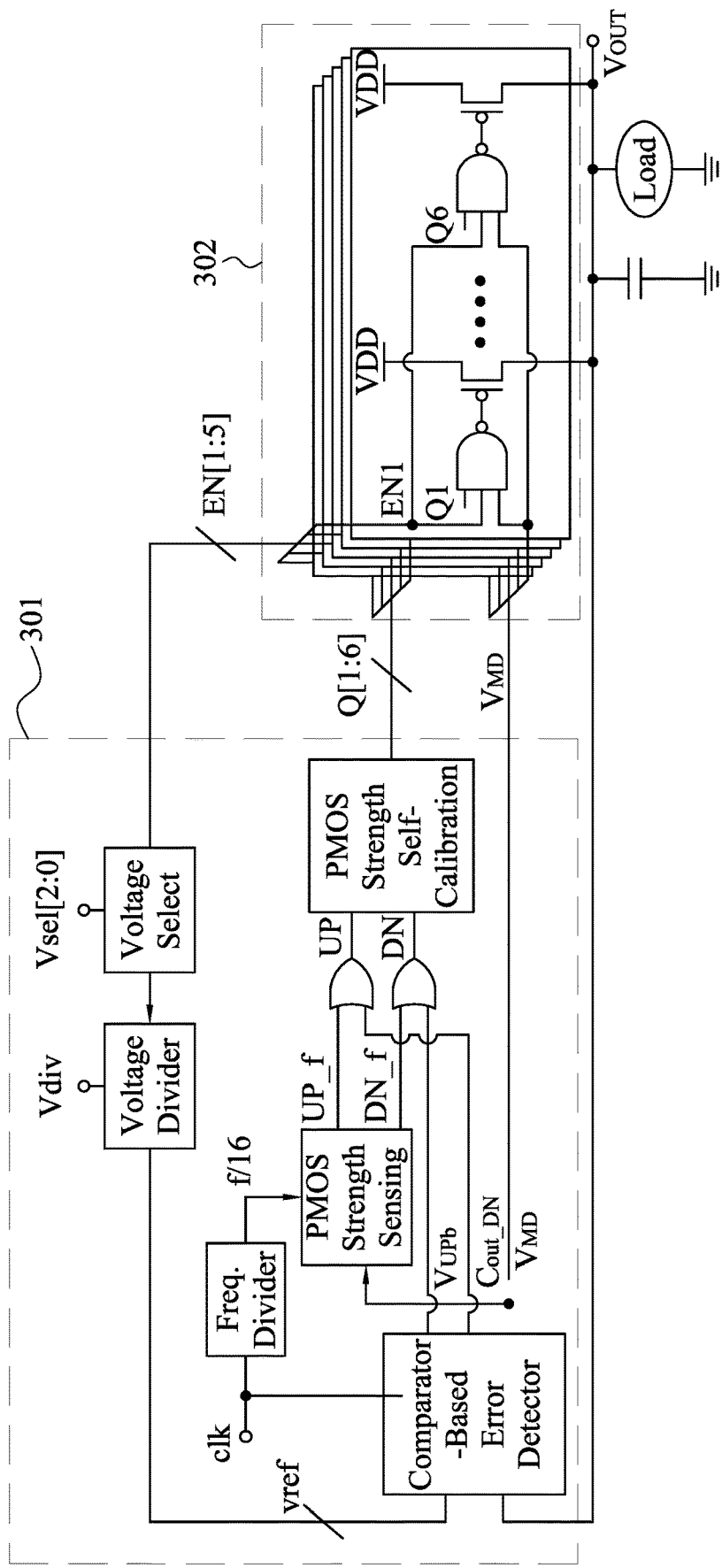
FIG. 22A illustrates a block diagram of a voltage regulator circuit that is implemented in a 3D IC according to some embodiments of the present disclosure.
Figure 22B:
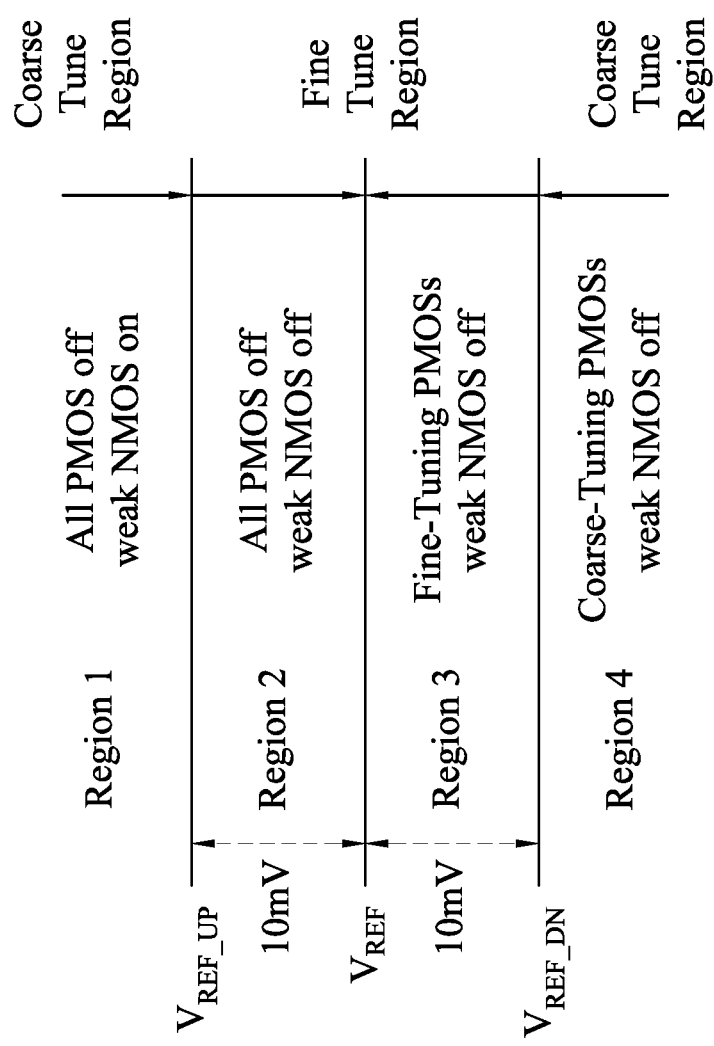
FIG. 22B shows the PMOS strength control mechanism of the voltage regulator circuit according to some embodiments of the present disclosure.

FIG. 22A illustrates a block diagram of a voltage regulator circuit that is implemented in the 3D IC as discussed above. The voltage regulator circuit is a digitally controlled linear voltage regulator that may generate output voltage from about 0.43V to about 0.55V in steps of about 25 mV to about 35 mV with a supply voltage of about 0.4V to about 0.8V. The voltage regulator circuit includes a control logic circuit 301 and a PMOS power transistor array 302 and a weak NMOS transistor. The control logic circuit 301 may include a comparator-based error detector, a voltage selector, a voltage divider, a frequency divider, PMOS strength sensing circuits, PMOS strength self-calibration circuits and pre drivers. FIG. 22B shows the PMOS strength control mechanism of the voltage regulator circuit. Three reference voltages ($V_{REF\_UP}$, $V_{REF}$, and $V_{REF\_DN}$) divide the voltage domain into four regions. When the output voltage is in region 1, all PMOS power transistors are turned off and the weak NMOS transistor is turned on for discharging the output voltage. Accordingly, output devices are turned off when the output voltage is in region 2. When the output voltage is in region 3 or region 4, PMOS power transistors are partially turned on and the weak NMOS transistor is turned off for charging the output voltage. According to the PMOS strength self-calibration technique, the PMOS strength is adjusted immediately by the voltage-detected coarse tune when the output voltage reaches region 1 or region 4, which means the large output ripple occurs. When the output voltage is suppressed within region 2 and region 3, the PMOS strength is adjusted by the timing-detected fine tune. The PMOS current can be adjusted for the PMOS strength self-calibration through the adjustable PMOS array 302. The row signals, EN1-EN5, in the adjustable PMOS array are controlled by the voltage selector corresponding to different output voltages. Only the signal EN1 is "1" at about 420 mV to about 440 mV, whereas EN1~EN5 are all "1" at about 540 mV to about 560 mV. The column signals, Q1-Q6, in the adjustable PMOS array are controlled by PMOS strength self-calibration circuits against loading current variations.

Figure 22C:
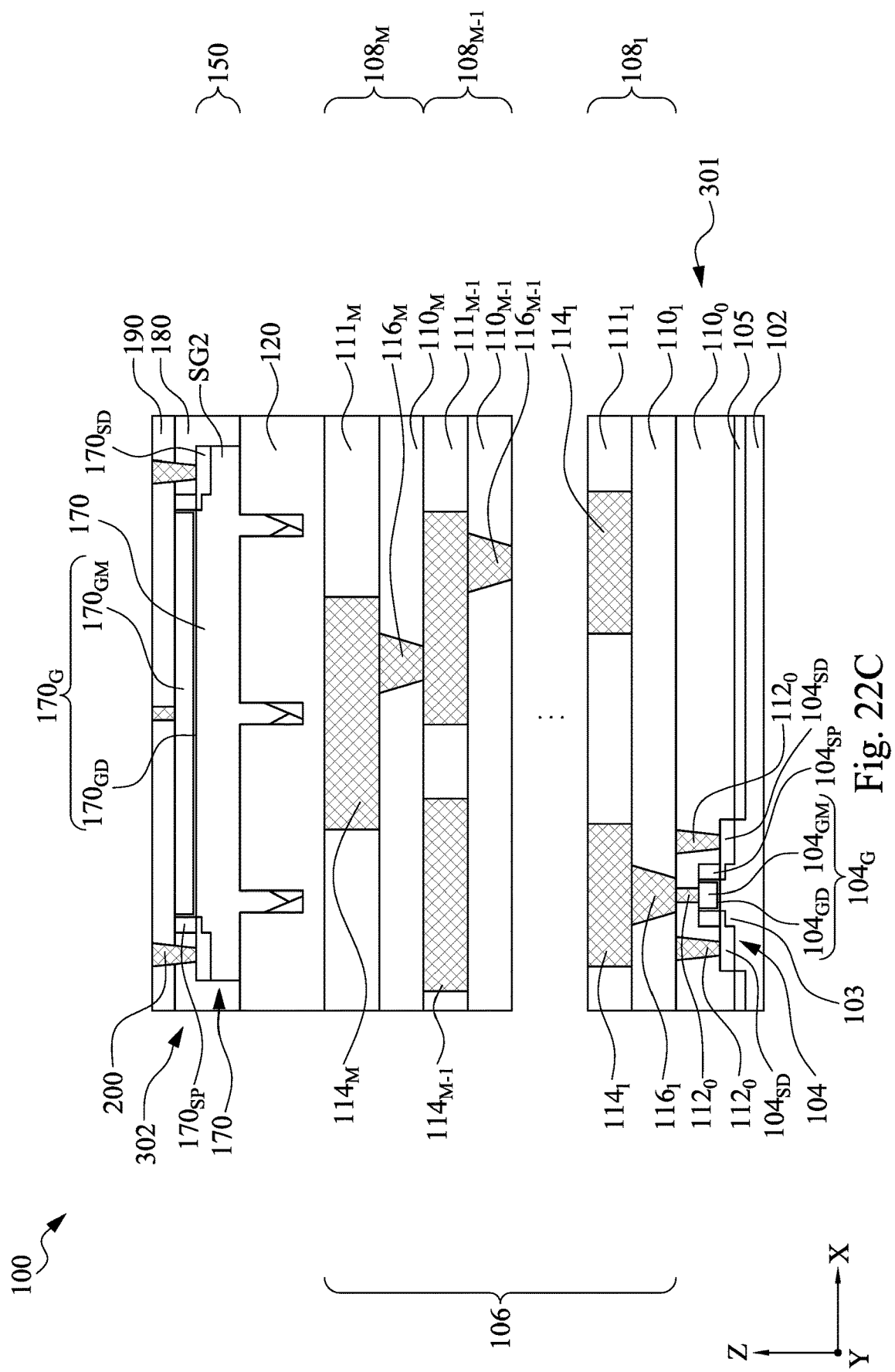
FIG. 22C illustrates a cross-sectional view of a voltage regulator implemented in a 3C IC according to some embodiments of the present disclosure.

FIG. 22C illustrates a cross-sectional view of a voltage regulator circuit implemented in a 3C IC according to some embodiments of the present disclosure. As illustrated in FIG. 22C, the control logic circuit 301 may include transistors 104 below the interconnect structure 106, and the PMOS power transistor array 302 may include the PMOS power transistors 170 above the interconnect structure 106. Notably, channel lengths (i.e., lateral distance between source/drain regions $170_{SD}$) of the PMOS power transistors 170 are much longer than channel lengths of transistors 104 of the control logic circuit 301. As a result, forming the PMOS power transistors 170 using the silicon fins 150 extending above the ILD layer 120 can reduce the IC's area compared with the case where the PMOS power transistors are formed at same level as the transistors 104 of the control logic circuit 301.

Figure 23A:
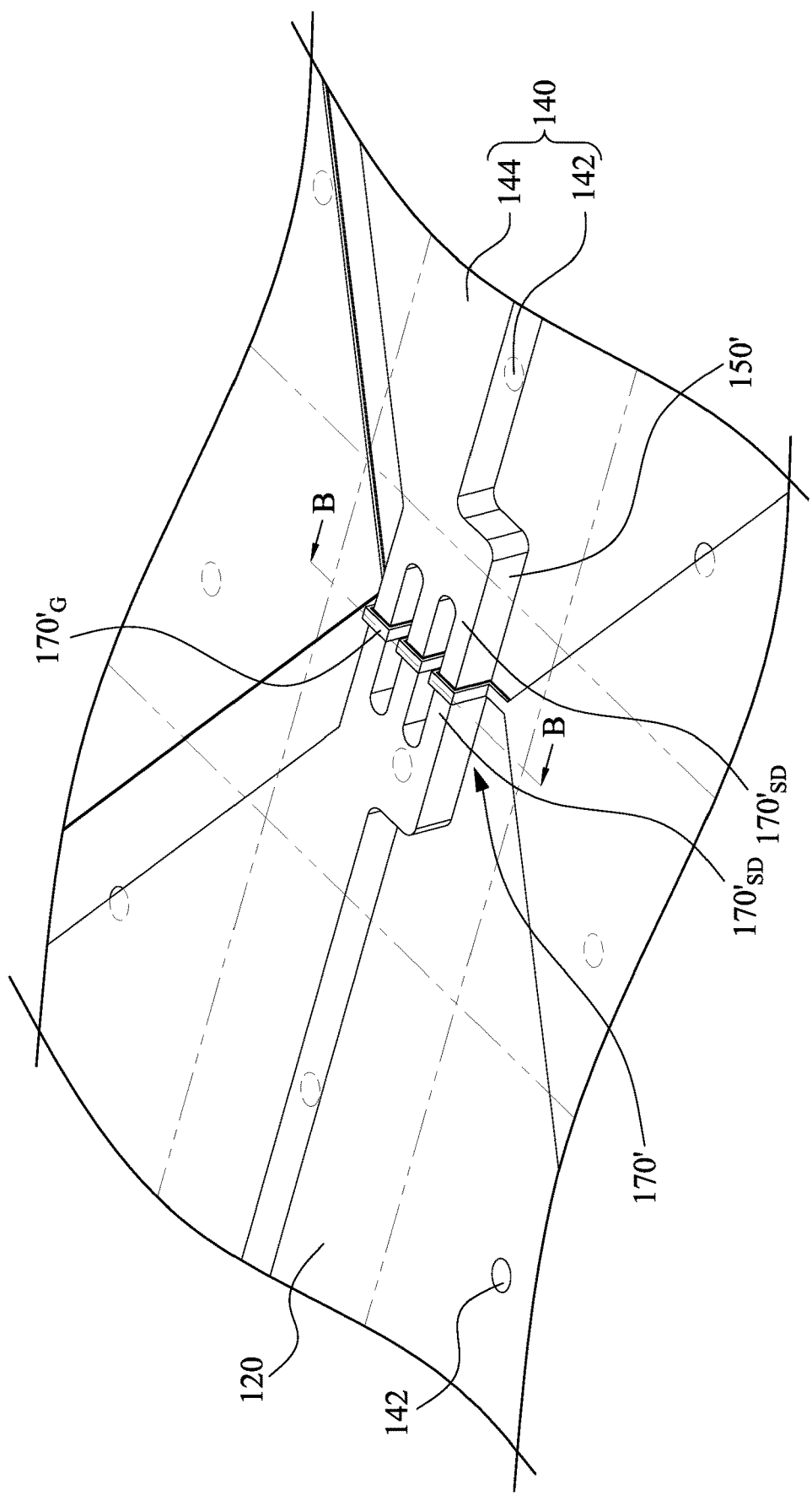
FIG. 23A illustrates an exemplary perspective view of a 3D IC according to some other embodiments of the present disclosure.
Figure 23B:
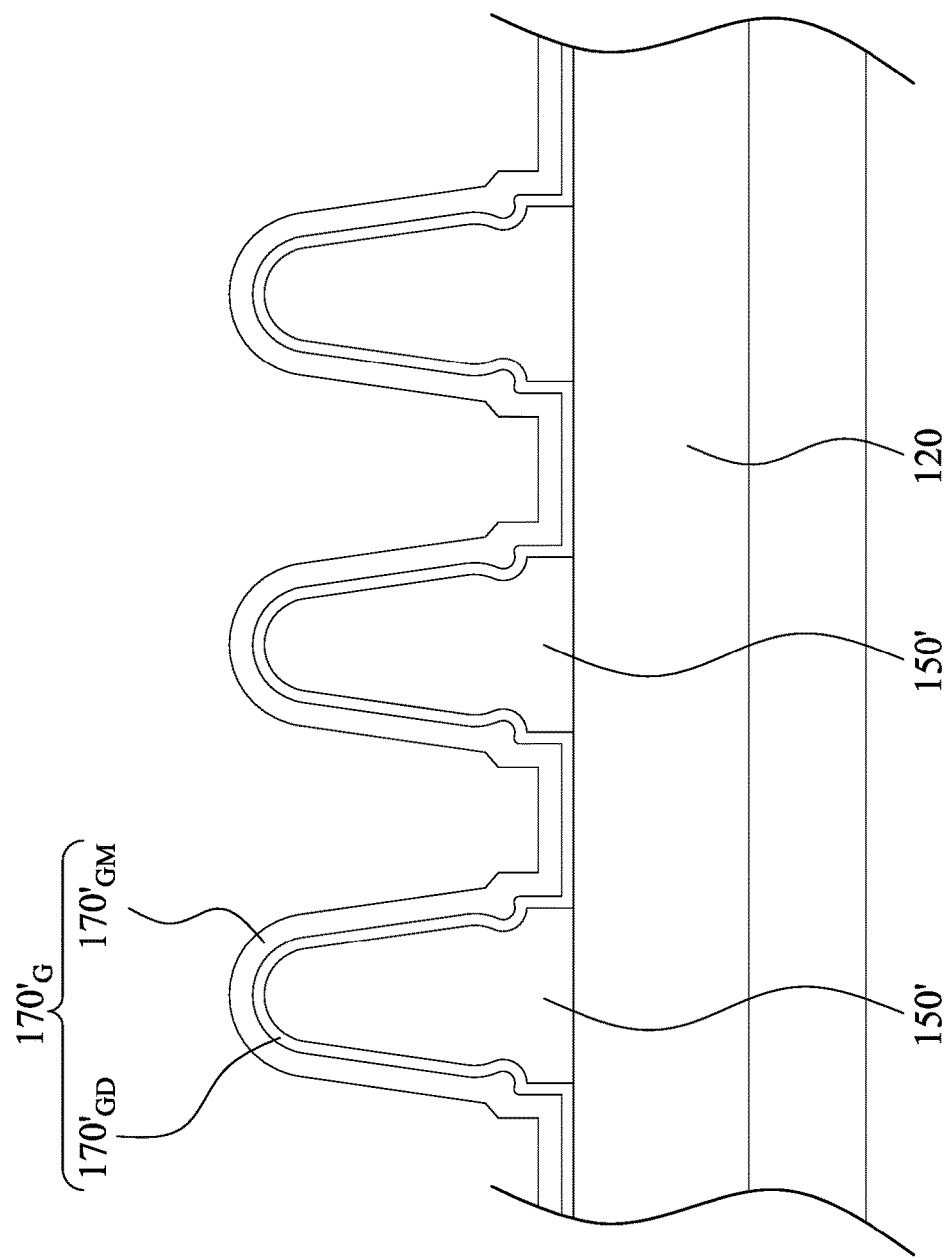
FIG. 23B illustrates a cross-sectional view taken along B-B line of FIG. 23A.

FIG. 23A illustrates an exemplary perspective view of a 3D IC according to some other embodiments of the present disclosure, and FIG. 23B illustrates a cross-sectional view taken along B-B line of FIG. 23A. As illustrated in FIG. 23A, the patterned polysilicon layer 140 still has polysilicon lateral portion 144 extending laterally from opposite ends of the silicon fins 150'. Moreover, some polysilicon plug portions 142 non-overlap the silicon fins 150' and the polysilicon lateral portion 144. Grid dash lines as shown in FIG. 23A represent grain boundaries of polysilicon layer 140 before patterning the polysilicon layer 140 as silicon fins 150'. Gate structure $170''_G$ extends across the silicon fins 150' and may include a gate dielectric layer $170'_{GD}$ and one or more gate metal layers $170'_{GM}$ over the gate dielectric layer $170'_{GD}$, as illustrated in FIG. 23B. Source/drain regions $170'_{SD}$ are formed in the silicon fins 150' and on opposite sides of the gate structures $170'_G$. The gate structures $170'_G$ is formed using a gate-first process, instead of a gate-last process that involves forming a dummy gate structure and replacing the dummy gate structure with a replacement gate structure, as illustrated in FIGS. 6A-8.

FIGS. 24-27 illustrate exemplary cross sectional views of various stages for manufacturing a 3D IC according to some other embodiments of the present disclosure. It is understood that additional operations can be provided before, during, and after processes shown by FIGS. 24-27, and some of the operations described below can be replaced or eliminated, for additional embodiments of the method. The order of the operations/processes may be interchangeable. The same or similar configurations, materials, processes and/or operation as described with FIGS. 1A-8 may be employed in the following embodiments, and the detailed explanation may be omitted.

Figure 24:
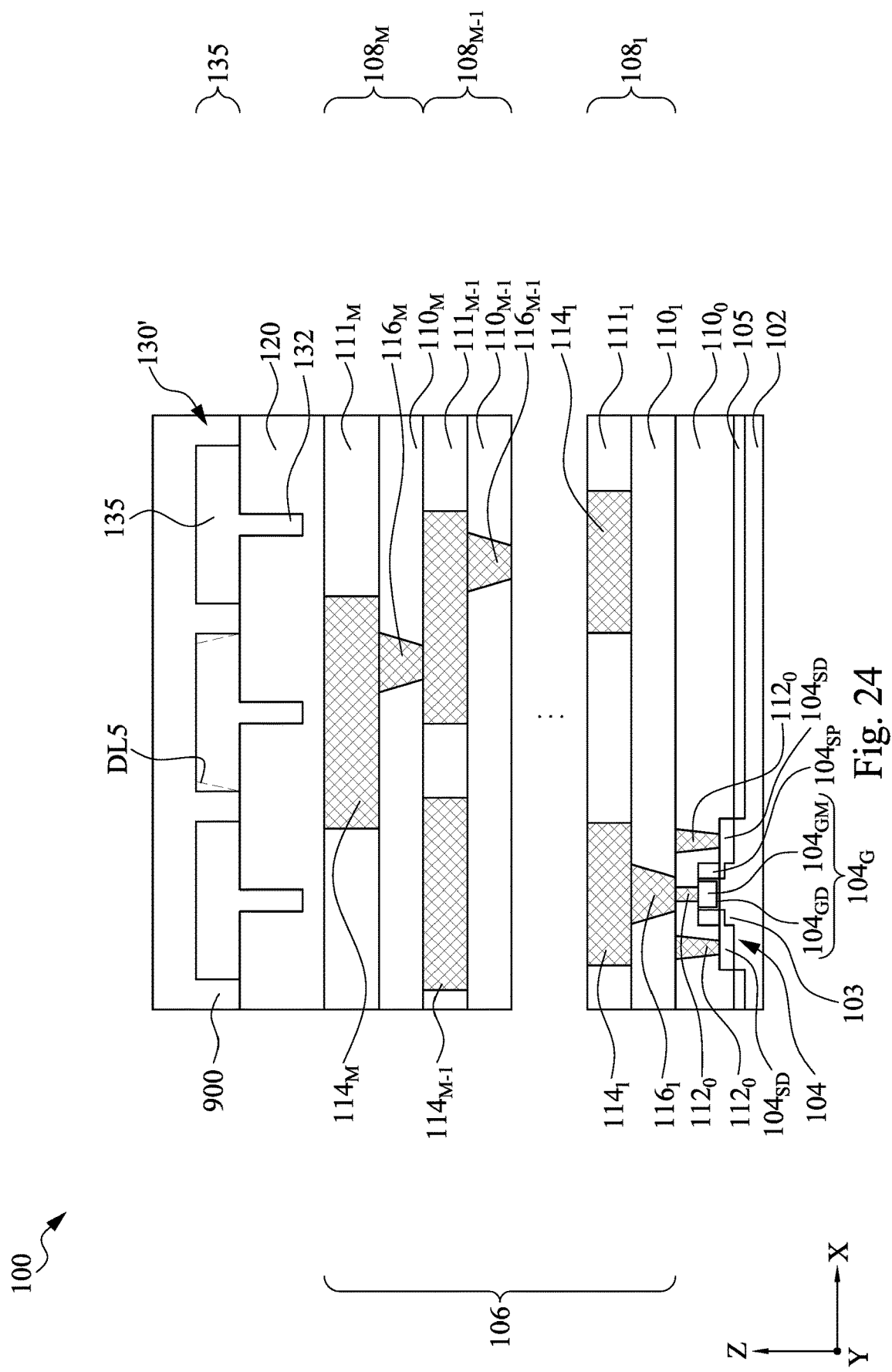
FIGS. 24-27 illustrate exemplary cross sectional views of various stages for manufacturing a 3D IC according to some other embodiments of the present disclosure.
Figure 25:
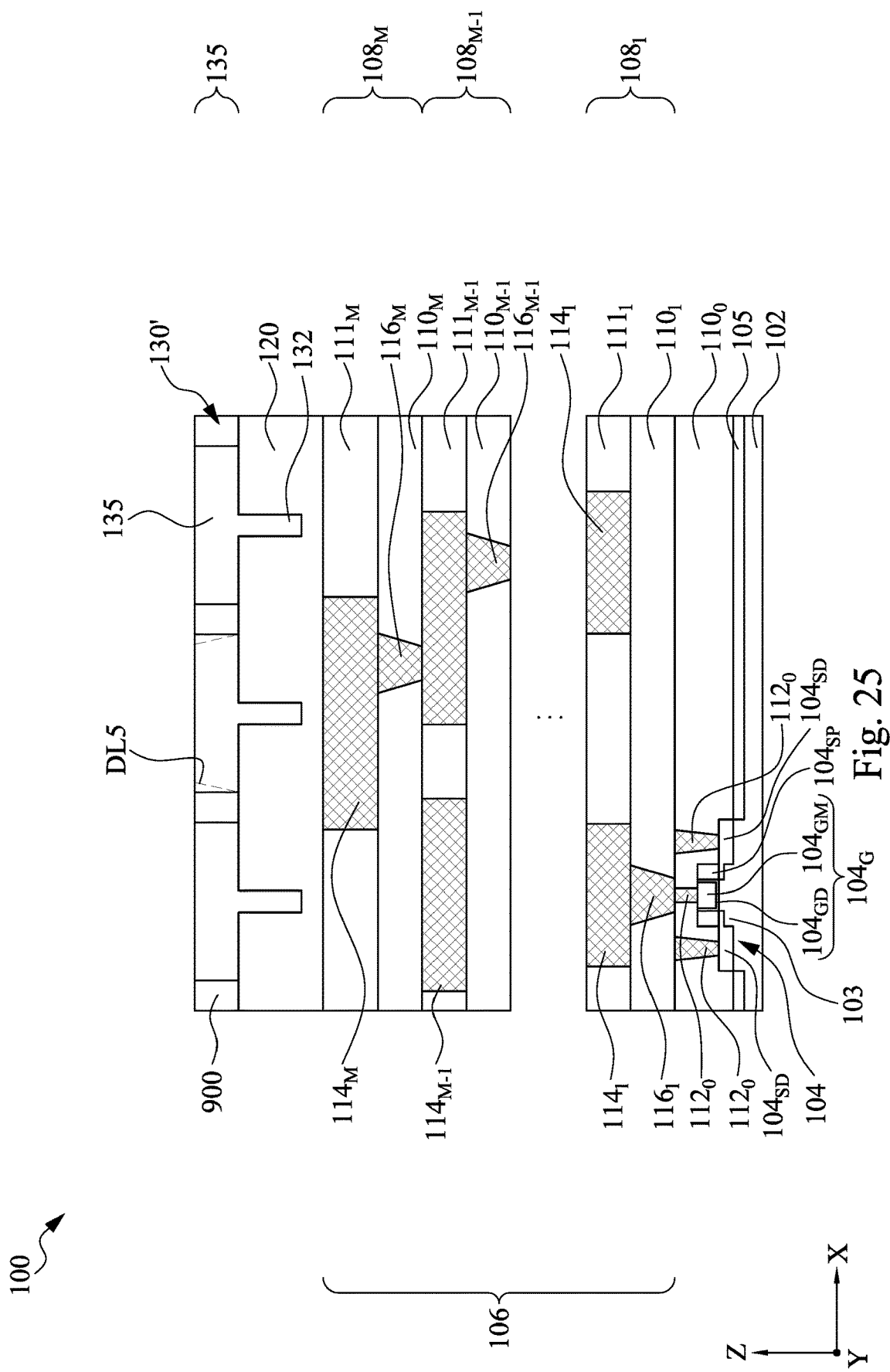

As shown in FIG. 24, after the amorphous silicon layer is patterned into the patterned amorphous silicon layer 130' (as discussed with respect to FIG. 15) and before the patterned amorphous silicon layer 130' is crystallized into a polysilicon layer (as discussed with respect to FIG. 16), a dielectric layer 900 is deposited over the patterned amorphous silicon layer 130' using suitable deposition techniques, such as ALD, CVD, flowable CVD or the like. The dielectric layer 900 includes, for example, silicon nitride, silicon oxide, silicon oxynitride, or the like. Afterwards, as illustrated in FIG. 25, a CMP process or an etch back process may be optionally carried out to the deposited dielectric layer 900 until the patterned amorphous silicon layer 130' is exposed, thus facilitating the following crystallization process performed by laser anneal.

Figure 26:
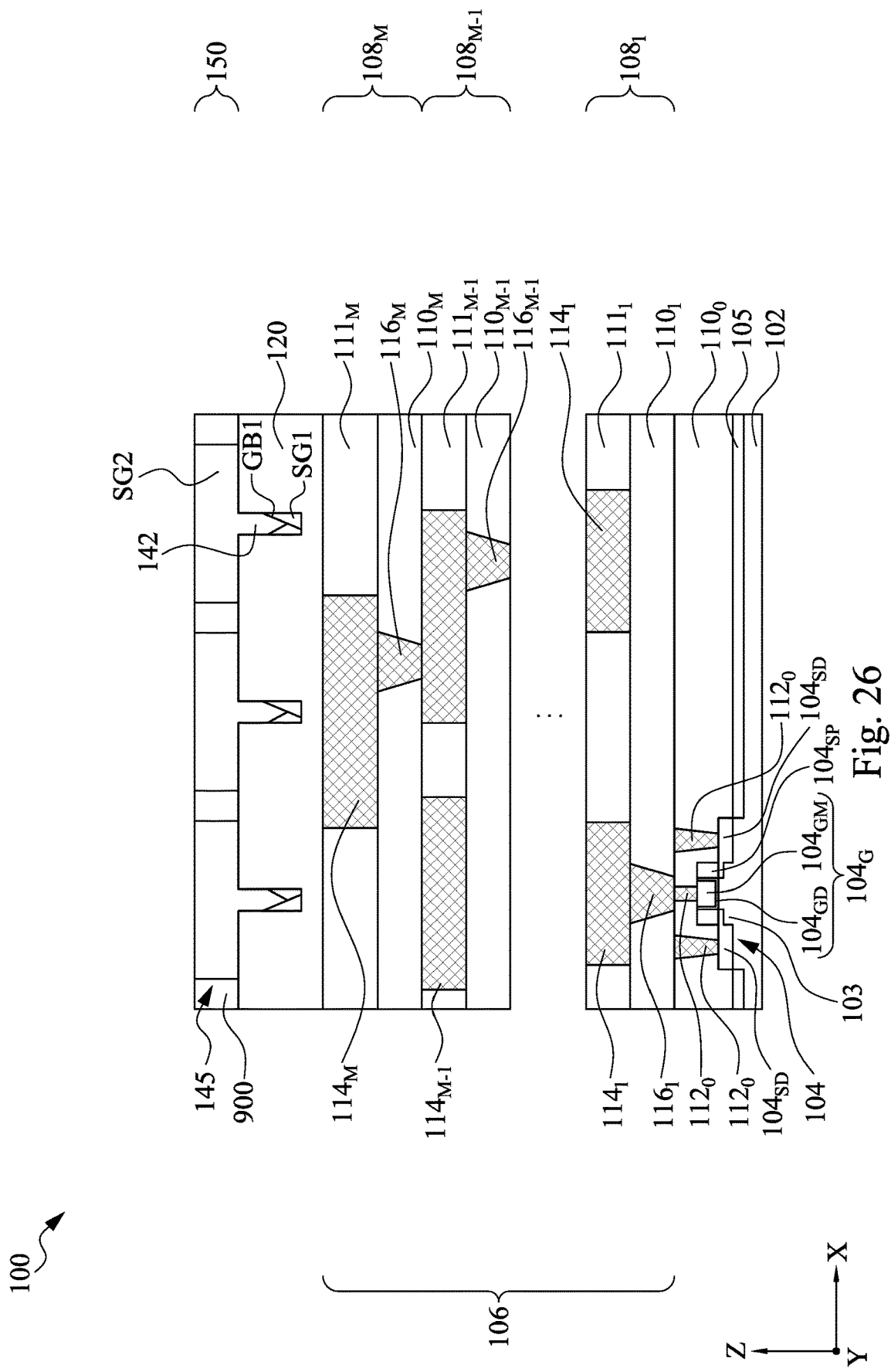
Figure 27:
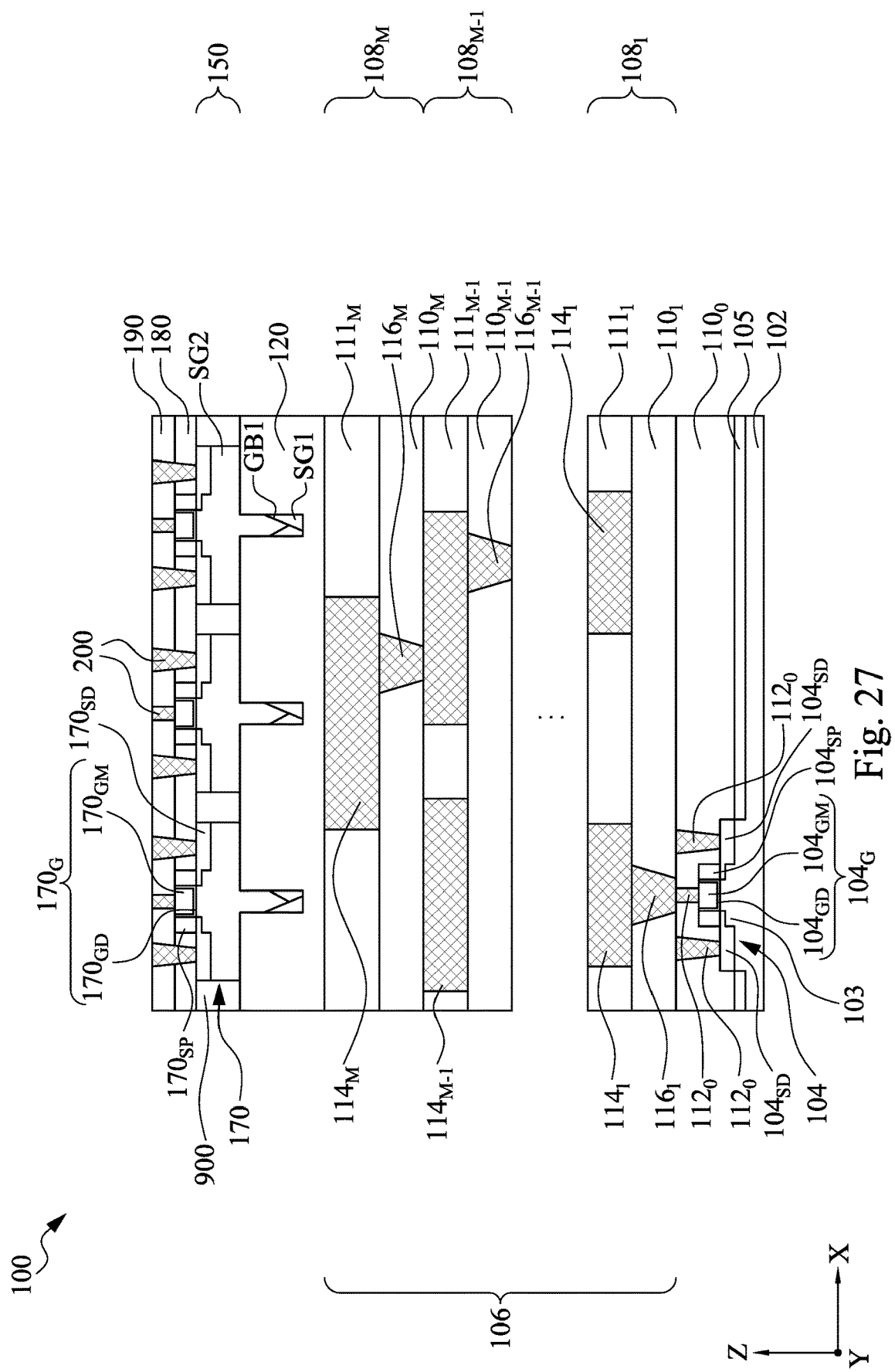

Thereafter, the patterned amorphous silicon layer 130' is crystallized into a patterned polysilicon layer 145 by, for example, directing a pulsed laser to the exposed amorphous silicon layer 130'. The resulting structure is illustrated in FIG. 26. The patterned polysilicon layer 145 has silicon fins 150 extending above the ILD layer 120 and polysilicon plug portions 142 extending in the ILD layer 120. The silicon fins 150 are spaced from each other by the dielectric layer 900. Stated another way, the patterned polysilicon layer 145 is segmented into multiple regions separated by the dielectric layer 900. Because expected polysilicon grain boundary regions have been removed and filled with the dielectric layer 900 in advance, the crystallization process may not form grain boundaries extending above the ILD layer 120. The crystallization process is similar to the descriptions with respect to FIGS. 4A and 4B, and thus is not repeated for the sake of brevity.

Afterwards, transistors 170 each including gate structure $170_G$ and source/drain regions $170_{SD}$ on opposite sides of the gate structure $170_G$ are formed on the silicon fins 150. Contacts 200 are then formed to land on the gate structure $170_G$ and source/drain regions $170_{SD}$. The resulting structure is illustrated in FIG. 17. Formation of the transistors 170 and contacts 200 is similar to the descriptions with respect to FIGS. 6A-8, and thus is not repeated for the sake of brevity.

The embodiments discussed above includes depositing amorphous silicon into holes in a dielectric layer formed over a BEOL interconnect structure, followed by crystallizing amorphous silicon into polycrystalline silicon, thus forming polycrystalline silicon plugs above the BEOL interconnect structure. In some other embodiments, amorphous silicon can be replaced with other suitable amorphous semiconductor materials, such as amorphous germanium or amorphous silicon germanium (SiGe). For example, amorphous germanium can be deposited into holes in the dielectric layer (e.g., the layer 120 as illustrated in FIG. 2B), followed by crystallizing amorphous germanium into polycrystalline germanium, thus forming polycrystalline germanium plugs extending in the dielectric layer and a crystalline germanium structure laterally extending along the top surface of the dielectric layer. Active devices (e.g., transistors) are then formed on the crystalline germanium structure. In this way, the active devices can have germanium channels. In some other embodiments, amorphous SiGe may be deposited into holes in the dielectric layer (e.g., the layer 120 as illustrated in FIG. 2B), followed by crystallizing amorphous SiGe into polycrystalline SiGe, thus forming polycrystalline SiGe plugs extending in the dielectric layer and a crystalline SiGe structure laterally extending along the top surface of the dielectric layer. Active devices (e.g., transistors) are then formed on the crystalline SiGe structure and thus have SiGe channels.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that grain boundaries of a polysilicon layer formed over an ILD layer can be controlled by etching holes in the ILD layer. Another advantage is that the polysilicon layer formed over the ILD layer can act as active regions of transistors, thus forming a 3D IC having lower transistors at a lower level (e.g., lower than an interconnect structure) and higher transistors at a higher level (e.g., higher than the interconnect structure). Therefore, a logic circuit, a memory circuit, a voltage regulator circuit, and/or other suitable circuits can be formed using the lower transistors and/or higher transistors. Moreover, another advantage is that decreased leakage current and improved on-current of transistors formed over a polysilicon layer can be achieved by controlling the grain boundaries of the polysilicon layer.

According to some embodiments, an integrated circuit structure includes a first transistor, an interconnect structure, a first dielectric layer, polycrystalline plugs, a semiconductor structure and a second transistor. The first transistor is formed on a substrate. The interconnect structure is over the first transistor. The first dielectric layer is over the interconnect structure. The polycrystalline plugs extend from a top surface of the dielectric layer into the dielectric layer. The semiconductor structure is disposed over the first dielectric layer. The second transistor is formed on the semiconductor structure.

According to some embodiments, an integrated circuit structure includes an interconnect structure, a dielectric layer, polycrystalline plugs, a semiconductor structure, and a transistor. The interconnect structure is above a substrate and includes a conductive via vertically extending above the substrate and a conductive line laterally extending above the conductive via. The dielectric layer is over the interconnect structure. The polycrystalline plugs are in the dielectric layer and arranged in rows and columns from top view. The semiconductor structure is disposed over the dielectric layer. The transistor is formed on the semiconductor structure.

According to some embodiments, a method includes forming an interconnect structure over a first transistor, forming a dielectric layer over the interconnect structure, etching the dielectric layer to form holes in the dielectric layer, depositing an amorphous layer in the holes of the dielectric layer and on a top surface of the dielectric layer, crystallizing the amorphous layer into a polycrystalline layer, and forming a second transistor on the polycrystalline layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
a first transistor formed on a substrate;
an interconnect structure over the first transistor;
a first dielectric layer over the interconnect structure;
polycrystalline plugs extending from a top surface of the first dielectric layer into the first dielectric layer;
a semiconductor structure disposed over the first dielectric layer;
a second transistor formed on the semiconductor structure; and
a spontaneous nucleation inhibition layer laterally extending along the top surface of the first dielectric layer, wherein the spontaneous nucleation inhibition layer further extends into the first dielectric layer and surrounds one of the polycrystalline plugs.

2. The IC structure of claim 1, wherein the polycrystalline plugs have a width and a height greater than the width.

3. The IC structure of claim 1, wherein the polycrystalline plugs have a height greater than half a thickness of the first dielectric layer.

4. The IC structure of claim 1, wherein the polycrystalline plugs extend through the first dielectric layer to the interconnect structure.

5. The IC structure of claim 1, wherein the polycrystalline plugs extend through the first dielectric layer and the interconnect structure to the substrate.

6. The IC structure of claim 1, wherein the semiconductor structure is segmented into multiple regions separated by a second dielectric layer.

7. The IC structure of claim 1, wherein the polycrystalline plugs have a round shape, a square shape or a rectangular shape from top view.

8. The IC structure of claim 1, where the second transistor has a channel length greater than a channel length of the first transistor.

9. The IC structure of claim 1, wherein the first transistor is of a control logic circuit of a voltage regulator circuit, and the second transistor is a power transistor of the voltage regulator circuit.

10. The IC structure of claim 1, wherein the polycrystalline plugs are spaced apart from source and drain regions of the first transistor.

11. An IC structure, comprising:
an interconnect structure above a substrate and comprising a conductive via vertically extending above the substrate and a conductive line laterally extending above the conductive via;
a dielectric layer over the interconnect structure;
polycrystalline plugs in the dielectric layer and arranged in rows and columns from top view;
a semiconductor structure disposed over the dielectric layer;
a transistor formed on the semiconductor structure; and
a spontaneous nucleation inhibition layer surrounding one of the polycrystalline plugs, wherein the one of the polycrystalline plugs has a grain boundary terminating at the spontaneous nucleation inhibition layer.

12. The IC structure of claim 11, wherein the semiconductor structure extends across one of the polycrystalline plugs.

13. The IC structure of claim 11, wherein the polycrystalline plugs have bottom ends higher than a bottom surface of the dielectric layer.

14. An IC structure comprising:
a transistor formed on a substrate;
an interconnect structure over the transistor;
a dielectric layer over the interconnect structure;
a polysilicon fin having a first portion laterally extending along a top surface of the dielectric layer, a second portion extending within the dielectric layer, and grain boundaries extending within the second portion and terminating prior to reaching the first portion, wherein the second portion of the polysilicon fin has a bottom surface overlapping the dielectric layer;
a gate structure extending across the first portion of the polysilicon fin; and
source/drain regions on the first portion of the polysilicon fin and on opposite sides of the gate structure.

15. The IC structure of claim 14, wherein the first portion of the polysilicon fin is single-crystalline.

16. The IC structure of claim 14, wherein the second portion of the polysilicon fin is separated from a drain region of the transistor.

17. The IC structure of claim 14, wherein the polysilicon fin has a longitudinal axis perpendicular to a longitudinal axis of the gate structure.

18. The IC structure of claim 14, wherein from a top view the polysilicon fin has a first side extending in a direction perpendicular to a longitudinal axis of the gate structure, and a second side extending parallel with the longitudinal axis of the gate structure, and the first side is longer than the second side.

19. The IC structure of claim 14, further comprising:
a spontaneous nucleation inhibition layer extending into the dielectric layer and surrounding the second portion of the polysilicon fin.

20. The IC structure of claim 14, further comprising:
a spontaneous nucleation inhibition layer surrounding the second portion of the polysilicon fin, wherein the grain boundaries of the polysilicon fin terminate at the spontaneous nucleation inhibition layer.

* * * * *